(12) United States Patent
Park et al.

(10) Patent No.: US 11,864,419 B2
(45) Date of Patent: Jan. 2, 2024

(54) TRANSPARENT DISPLAY APPARATUS

(71) Applicant: LG Display Co., Ltd., Seoul (KR)

(72) Inventors: Sunghee Park, Paju-si (KR); Sunyoung Park, Paju-si (KR); Taehee Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/898,415

(22) Filed: Aug. 29, 2022

(65) Prior Publication Data

US 2023/0061110 A1 Mar. 2, 2023

(30) Foreign Application Priority Data

Aug. 31, 2021 (KR) .................. 10-2021-0115631

(51) Int. Cl.
*G09G 3/20* (2006.01)
*H10K 59/121* (2023.01)

(52) U.S. Cl.
CPC ......... *H10K 59/121* (2023.02); *G09G 3/2092* (2013.01)

(58) Field of Classification Search
CPC . G09G 3/2092; H01L 27/326; H01L 27/3234; H01L 27/3225
See application file for complete search history.

(56) References Cited

U.S. PATENT DOCUMENTS

| | | | |
|---|---|---|---|
| 2017/0110521 A1* | 4/2017 | Park | H01L 51/5209 |
| 2020/0110525 A1* | 4/2020 | Park | H01L 27/3244 |
| 2020/0273927 A1* | 8/2020 | Oh | H10K 59/121 |
| 2020/0403180 A1 | 12/2020 | Seon et al. | |
| 2021/0026419 A1* | 1/2021 | Kim | G06F 1/1658 |
| 2021/0111374 A1* | 4/2021 | Sung | H01L 51/5253 |
| 2021/0126078 A1* | 4/2021 | Lee | H01L 27/3227 |
| 2021/0143244 A1 | 5/2021 | Kim et al. | |
| 2021/0183986 A1 | 6/2021 | Shin et al. | |
| 2021/0202628 A1 | 7/2021 | Kim et al. | |
| 2021/0202683 A1 | 7/2021 | Lee et al. | |
| 2021/0319198 A1* | 10/2021 | Seomoon | A61B 5/6898 |
| 2022/0069052 A1* | 3/2022 | Liu | G06F 3/04164 |
| 2022/0254288 A1* | 8/2022 | Huang | G09G 3/20 |

FOREIGN PATENT DOCUMENTS

KR 10-2020-0135689 A 12/2020
KR 10-2020-0145954 A 12/2020

* cited by examiner

*Primary Examiner* — Yuzhen Shen
(74) *Attorney, Agent, or Firm* — Seed IP Law Group LLP

(57) ABSTRACT

A transparent display apparatus is provided, which reduces a visibility difference between a non-display area and a display area, and has excellent encapsulation characteristics. The transparent display apparatus comprises a substrate having a display area and a non-display area adjacent to the display area, a plurality of pixels disposed in the display area, having a first transmissive portion, and a second transmissive portion disposed in the non-display area.

18 Claims, 11 Drawing Sheets

TRANSPARENT DISPLAY APPARATUS

CROSS-REFERENCE TO RELATED APPLICATIONS

This application claims the benefit of the Korean Patent Application No. 10-2021-0115631 filed on, Aug. 31, 2021, which are hereby incorporated by reference as if fully set forth herein.

BACKGROUND

Technical Field

The present disclosure relates to a transparent display apparatus.

Description of the Related Art

With the advancement of the information age, the demand for a display device for displaying an image has increased in various forms. Therefore, various types of display devices such as a liquid crystal display (LCD) device, a plasma display panel (PDP) device, an organic light emitting display (OLED) device and a quantum dot light emitting display (QLED) device have been recently used.

Recently, studies for a transparent display apparatus in which a user may view objects or images positioned at an opposite side by transmitting through the display apparatus are actively ongoing.

The transparent display apparatus includes a display area on which an image is displayed, and a non-display area that includes a bezel area, wherein the display area may include a transmissive area capable of transmitting external light, and a non-transmissive area. The transparent display apparatus may have high light transmittance through the transmissive area of the display area, and a light emission area may be disposed in the non-transmissive area.

The transparent display apparatus may be manufactured by bonding a lower substrate having a light emission area and a transmissive area to an upper substrate disposed to face the lower substrate by using an opaque adhesive. Since the opaque adhesive is positioned in the non-display area, when a plurality of transparent display apparatuses are disposed to be adjacent to each other, it disrupts uniformity of the transparent display apparatuses.

Therefore, a transparent adhesive is used instead of the opaque adhesive positioned in the non-display area, and circuits positioned in the non-display area are changed to be transparent so as to improve uniformity.

BRIEF SUMMARY

The inventors have realized that a visible difference is present between the non-display area and the display area due to a different structure between the non-display area and the display area. For example, the non-display area has no transmissive areas, whereas the display area does. The present disclosure has been formed in view of the above problems and embodiments thereof provide a transparent display apparatus that has a reduced difference in visual appearance between a non-display area and a display area.

In addition to the benefits of the present disclosure as mentioned above, additional benefits and features of the present disclosure will be clearly understood by those skilled in the art from the following description of the present disclosure.

In accordance with an embodiment of the present disclosure, the above and other benefits can be accomplished by the provision of a transparent display apparatus comprising a substrate having a display area and a non-display area adjacent to the display area, a plurality of pixels disposed in the display area, having a first transmissive portion, and a second transmissive portion disposed in the non-display area.

In accordance with another embodiment of the present disclosure, the above and other benefits can be accomplished by the provision of a transparent display apparatus comprising a substrate having a display area having a first transmissive portion and a non-display area adjacent to the display area, a transparent connection member disposed in the non-display area, and an opposite substrate facing the substrate, connected to the transparent connection member, wherein the substrate includes a second transmissive portion overlapped with the transparent connection member.

In accordance with various embodiments, a transparent display apparatus comprises a substrate having a display area and a non-display area adjacent to the display area. A pixel is disposed in the display area, and has a first light transmissive portion. A transparent connection member is disposed in the non-display area. A second light transmissive portion is disposed in the non-display area. The second transmissive portion is overlapped with the transparent connection member. The reference herein to transmissive means light transmissive. Namely, it can transmit light.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

and

Figure 10:
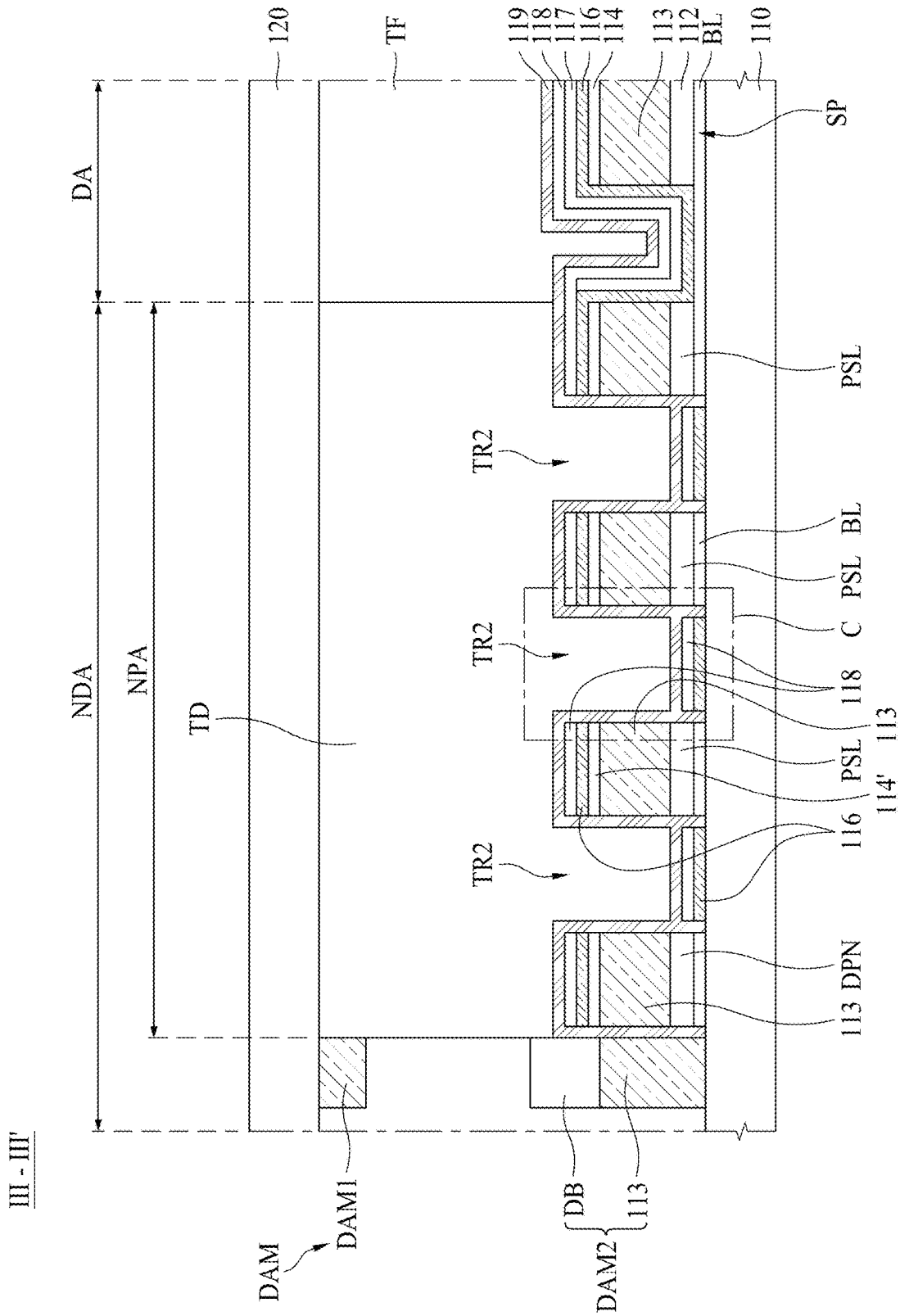
FIG. 10 is a schematic cross-sectional view taken along line shown in FIG. 3.
Figure 11:
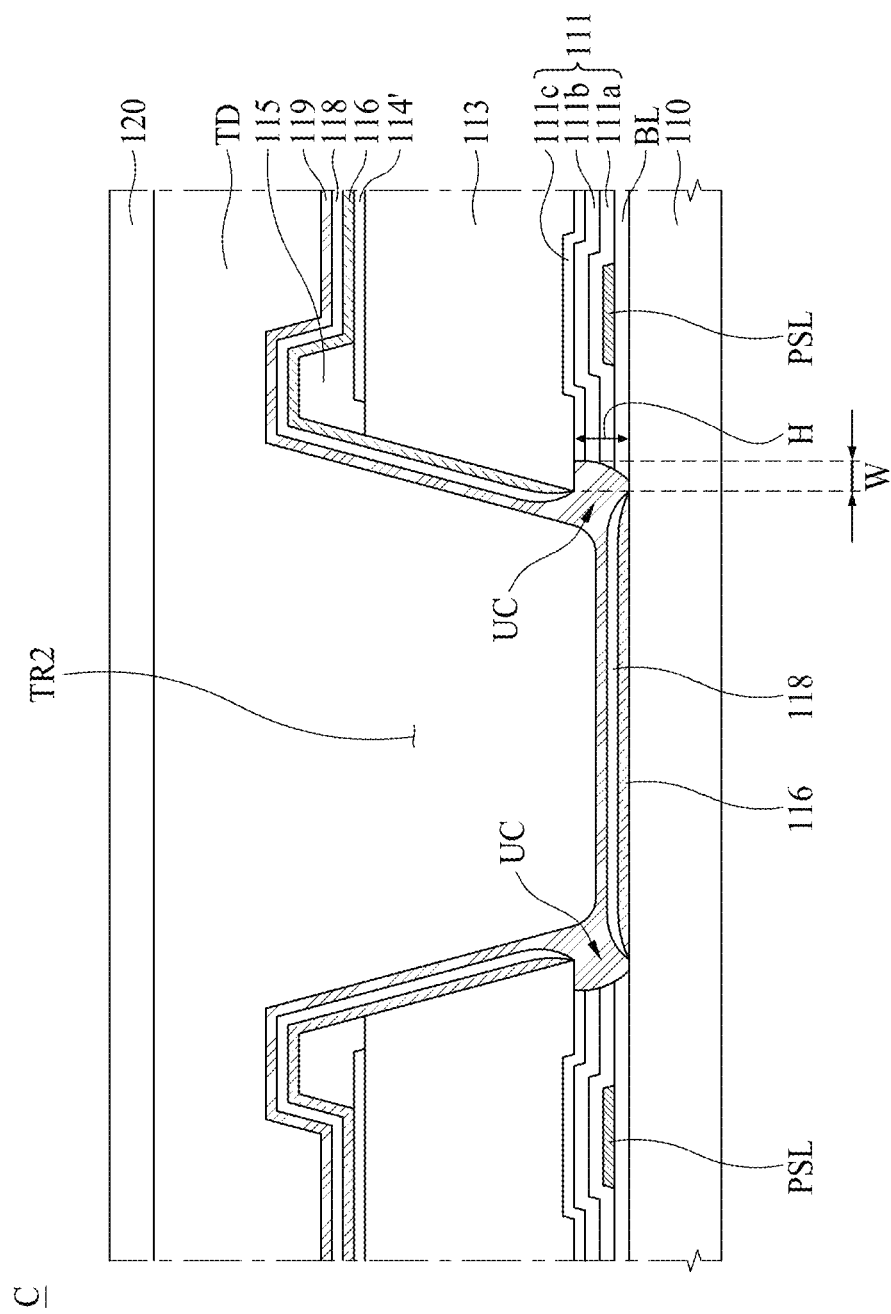

FIG. 11 is a schematic enlarged view illustrating a portion C of FIG. 10.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the preferred embodiments of the present disclosure will be described in detail with reference to the accompanying drawings.

Figure 1:
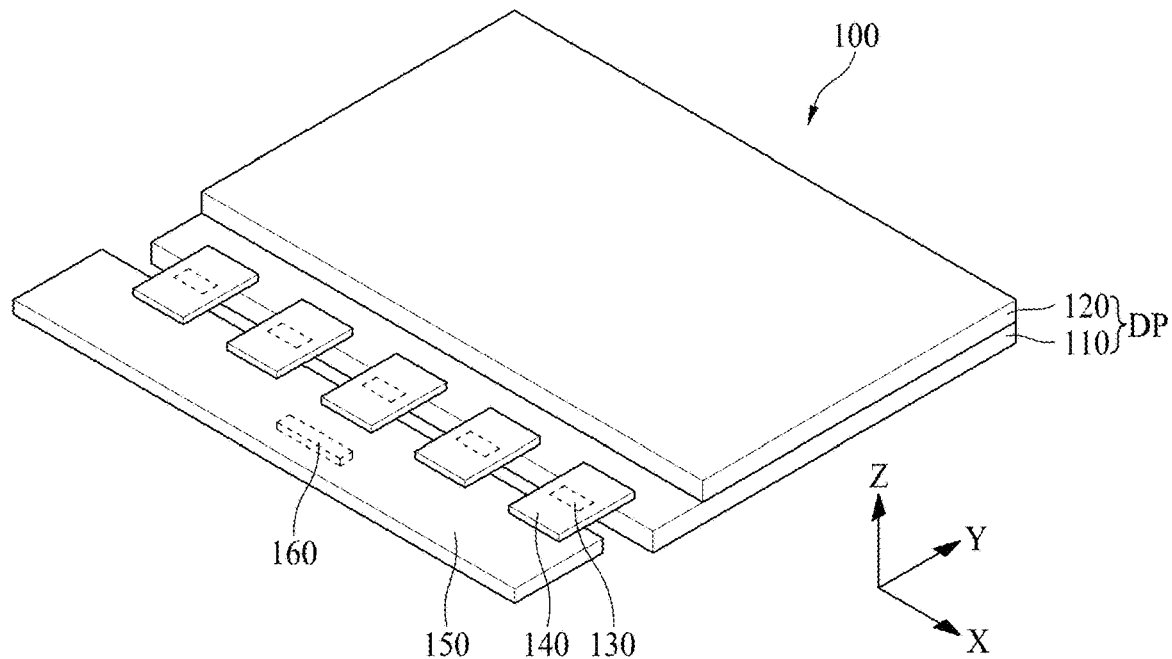
FIG. 1 is a perspective view illustrating a transparent display apparatus according to one embodiment of the present disclosure.
Figure 2:
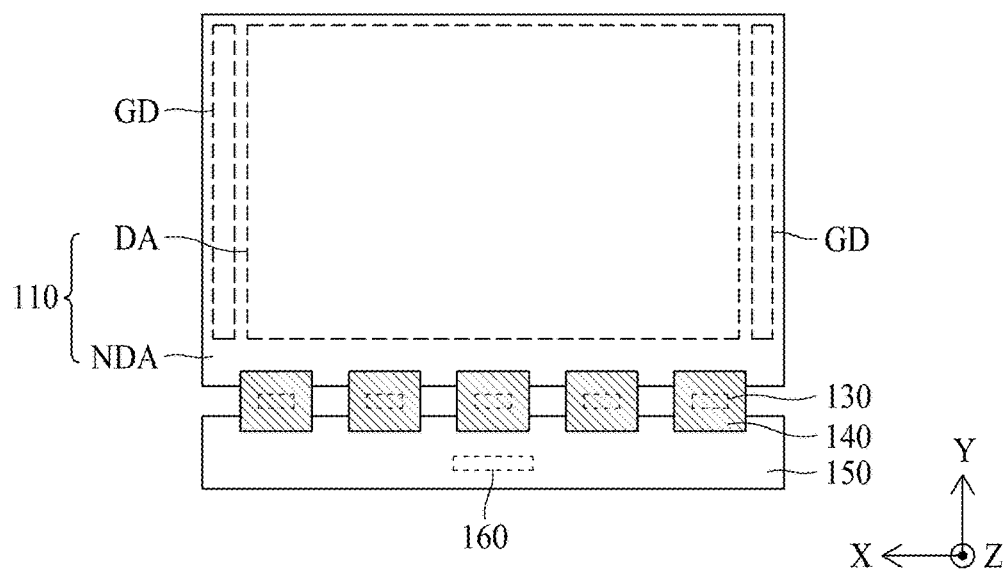
FIG. 2 is a plan view illustrating a first substrate, a source drive IC, a flexible film, a circuit board and a timing controller of FIG. 1.
Figure 3:
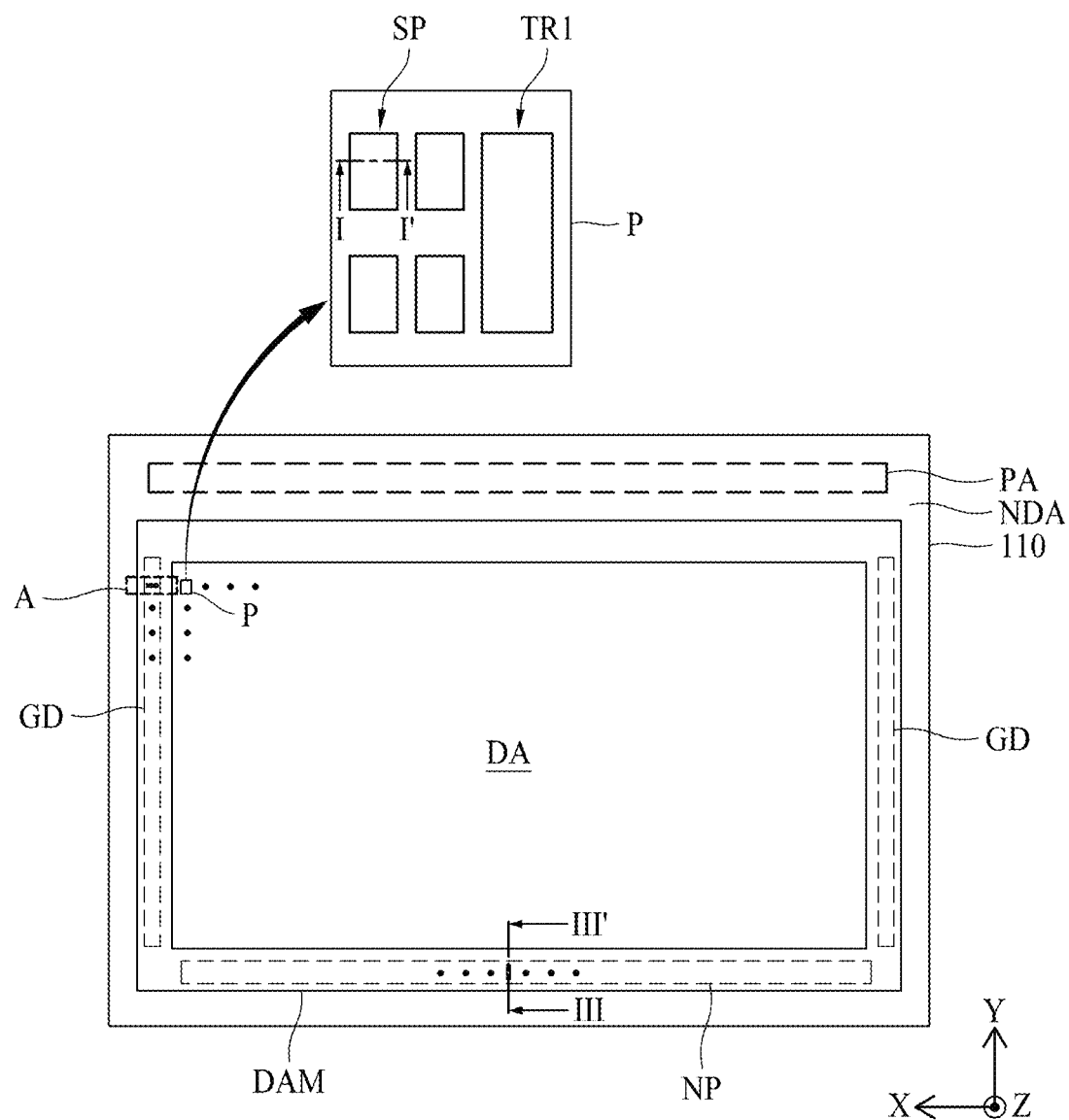
FIG. 3 is a schematic plan view illustrating the first substrate.
Figure 4:
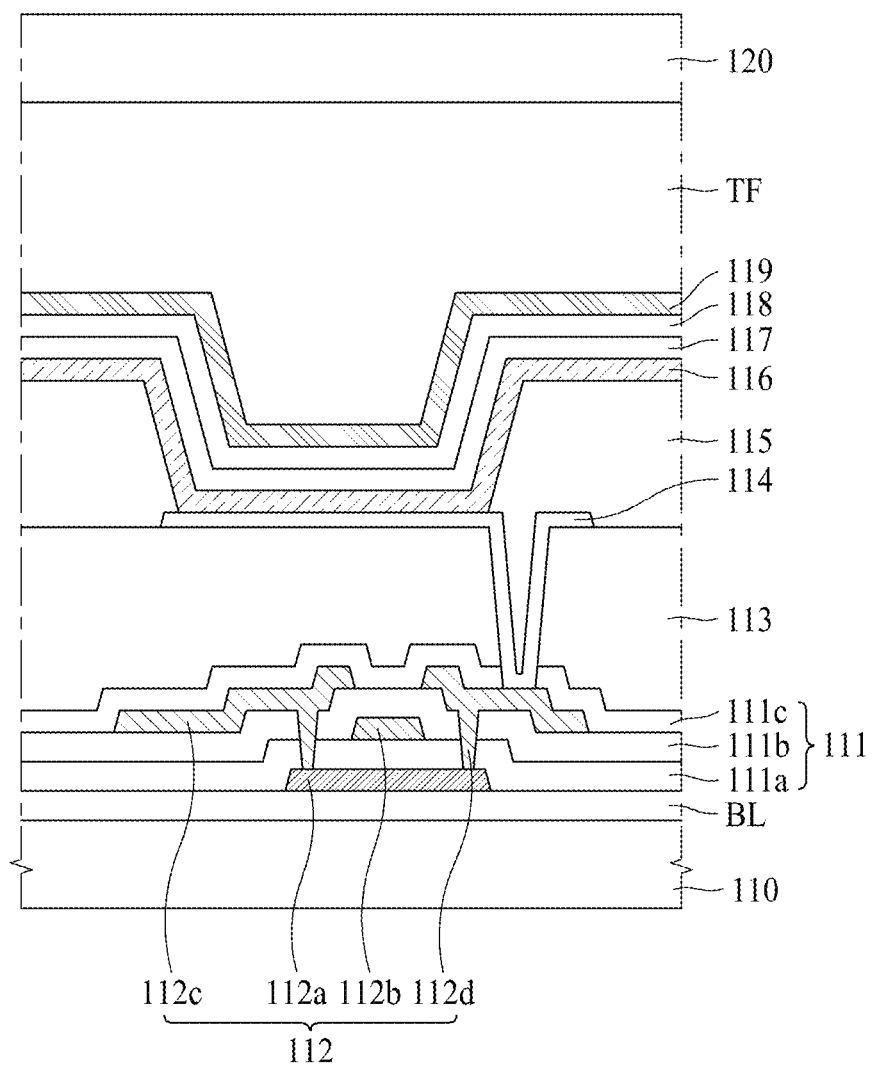
FIG. 4 is a schematic cross-sectional view taken along line I-I' shown in FIG. 3.
Figure 5:
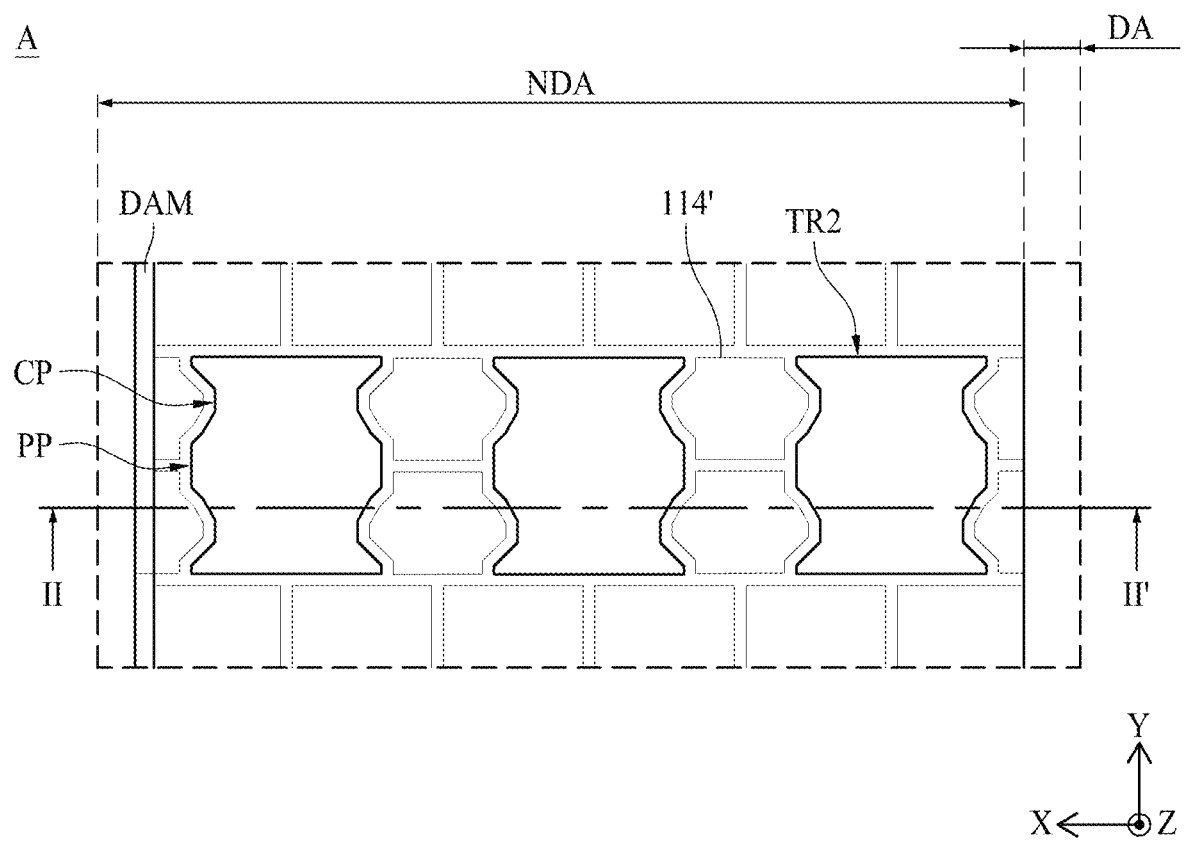
FIG. 5 is a schematic enlarged view illustrating a portion A of FIG. 3.
Figure 6:
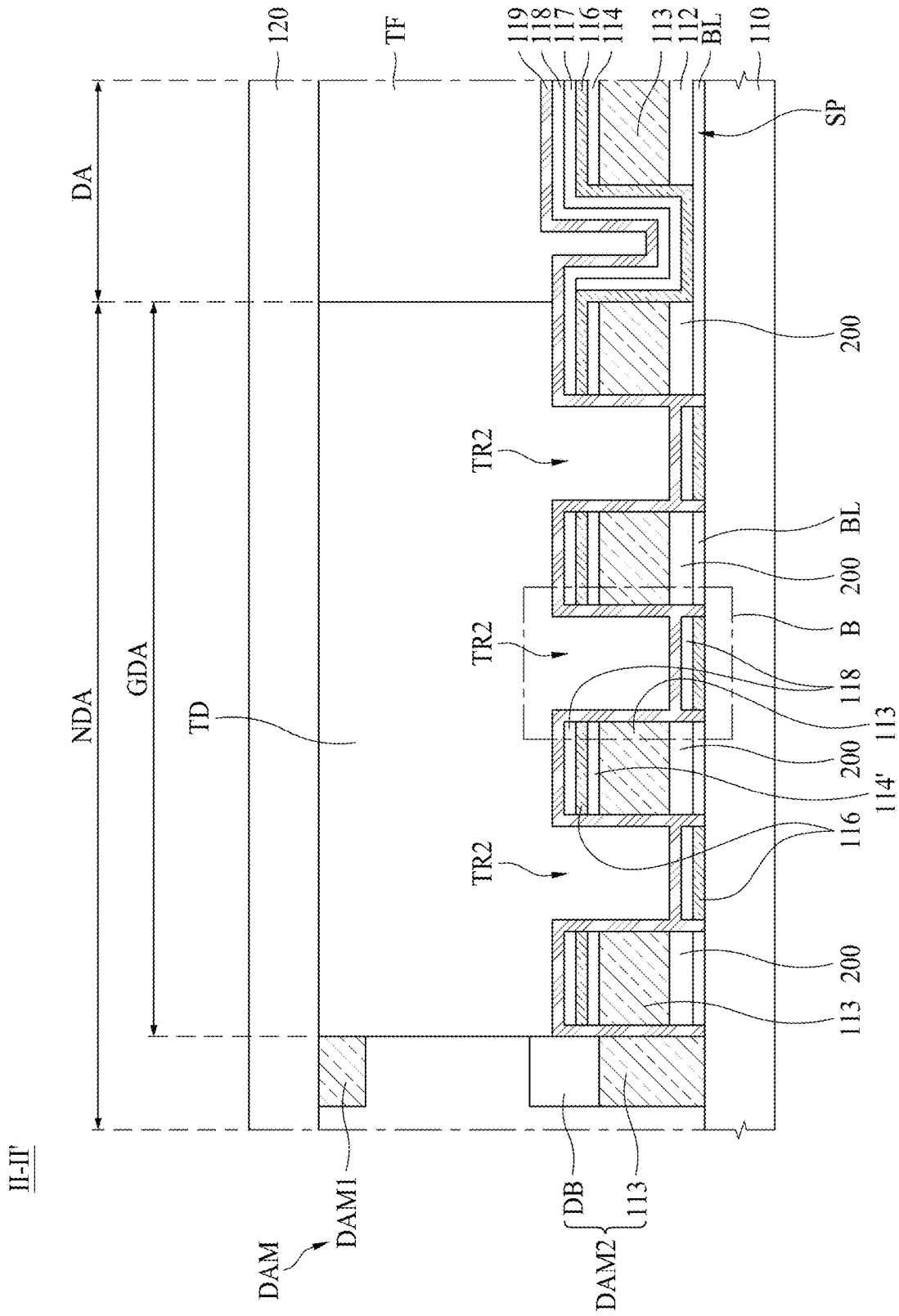
FIG. 6 is a schematic cross-sectional view taken along line II-II' shown in FIG. 5.
Figure 7:
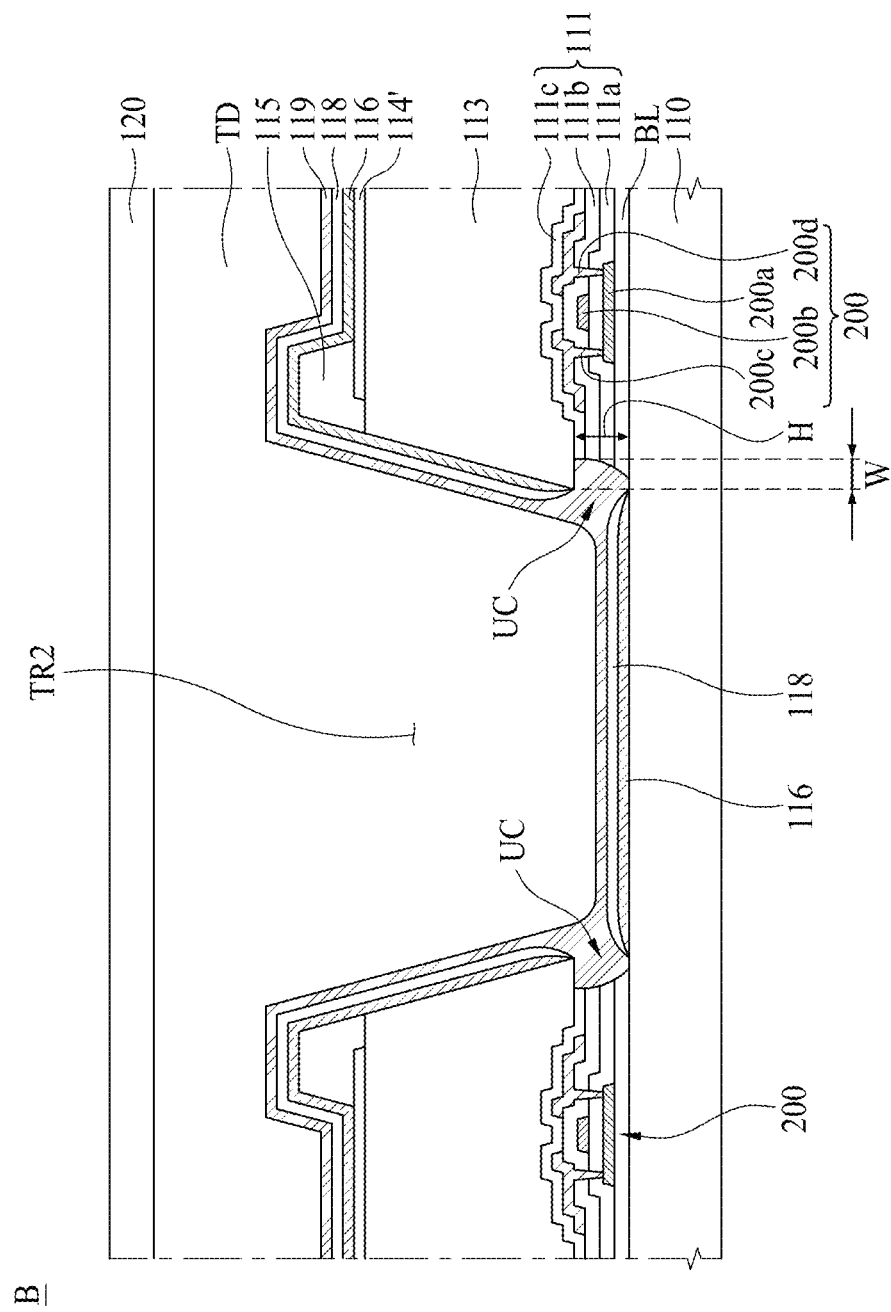
FIG. 7 is a schematic enlarged view illustrating a portion B of FIG. 6.

FIG. 1 is a perspective view illustrating a transparent display apparatus according to one embodiment of the present disclosure, FIG. 2 is a plan view illustrating a first substrate, a source drive IC, a flexible film, a circuit board and a timing controller of FIG. 1, FIG. 3 is a schematic plan view illustrating the first substrate, FIG. 4 is a schematic cross-sectional view taken along line I-I' shown in FIG. 3, FIG. 5 is a schematic enlarged view illustrating a portion A of FIG. 3, FIG. 6 is a schematic cross-sectional view taken along line II-IP shown in FIG. 5, and FIG. 7 is a schematic enlarged view illustrating a portion B of FIG. 6.

Hereinafter, the following description will be based on that a transparent display apparatus 100 according to one embodiment of the present disclosure is an organic light emitting display apparatus, but is not limited thereto. That is, the transparent display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 7, the display apparatus 100 according to one embodiment of the present disclosure may include a display panel DP having a gate driver GD, a source drive integrated circuit (hereinafter, referred to as "IC") 130, a flexible film 140, a circuit board 150, and a timing controller 160.

The display panel DP may include a substrate 110 and an opposite substrate 120, which are bonded to each other.

The substrate 110 may include a thin film transistor, and may be a transistor array substrate, a lower substrate, a base substrate, or a first substrate. The substrate 110 may be a transparent glass substrate or a transparent plastic substrate. For example, the substrate 110 may be a transparent glass substrate. Hereinafter, the substrate 110 may be referred to as the first substrate 110.

The opposite substrate 120 may be bonded to the first substrate 110 via a transparent connection member TD (shown in FIG. 6). For example, the opposite substrate 120 may have a size smaller than that of the first substrate 110, and may be bonded to the remaining portion other than the pad area PA (shown in FIG. 3) of the first substrate 110. The transparent connection member TD may be an adhesive member (or transparent adhesive). The opposite substrate 120 may be an upper substrate, a second substrate, or an encapsulation substrate. The opposite substrate 120 may be bonded to a first surface of the first substrate 110 by a substrate bonding process using an adhesive member. Hereinafter, the opposite substrate 120 may be referred to as the second substrate 120.

The first substrate 110 according to an example may include a display area DA and a non-display area NDA.

The display area DA is an area where an image is displayed, and may be a pixel array area, an active area, a pixel array unit or structure, a display unit or structure, or a screen. For example, the display area DA may be disposed at a central portion of the display panel DP.

The display area DA according to an example may include gate lines, data lines, pixel driving power lines, and a plurality of pixels P. Each of the plurality of pixels P may include a plurality of subpixels SP that may be defined by (e.g., positioned at regions of overlap of) the gate lines and the data lines, and a first transmissive portion TR1 (shown in FIG. 3) disposed to be adjacent to some or all of the plurality of subpixels SP. The first transmissive portion TR1 is an area provided to allow light to transmit through front and rear surfaces of the display panel DP. Therefore, a user located in the direction of the front surface of the display panel DP may view an image or background positioned in the direction of the rear surface of the display panel DP through the first transmissive portion TR1.

Each of the plurality of subpixels SP may be defined as a minimum unit area in which light is actually emitted.

According to an example, at least four subpixels disposed to be adjacent to one another among the plurality of subpixels SP or four subpixels disposed to be adjacent to one another along a longitudinal direction of the gate line (or data line), and one first transmissive portion TR1 constitute one unit pixel. One unit pixel may include, but is not limited to, a red subpixel, a green subpixel, a blue subpixel, a white subpixel, and a first transmissive portion TR1. As an example, one unit pixel may include at least two or more red subpixels, at least two or more green subpixels, at least two or more blue subpixels, at least two or more white subpixels, and at least two or more first transmissive portions TR1.

According to another example, three subpixels disposed to be adjacent to one another among the plurality of subpixels SP or three subpixels disposed to be adjacent to one another along the longitudinal direction of the gate line (or data line), and one first transmissive portion TR1 constitute one unit pixel. One unit pixel may include, but is not limited to, at least one or more red subpixels, at least one or more green subpixels, at least one or more blue subpixels, and at least one or more first transmissive portions TR1.

Each of the plurality of subpixels SP includes a thin film transistor and a light emitting portion connected to the thin film transistor. The light emitting portion may include a light emitting element layer (or organic light emitting layer) interposed between a first electrode and a second electrode.

The light emitting element layers respectively disposed in the plurality of subpixels SP may individually emit light of their respective colors different from one another or commonly emit white light. According to an example, when the light emitting element layers of the plurality of subpixels SP commonly emit white light, each of the red subpixel, the green subpixel and the blue subpixel may include a color filter (or wavelength conversion member) for converting white light into light of its respective different color. In this case, the white subpixel according to an example may not include a color filter. At least a portion of the white subpixel according to another example may include the same color filter as any one of the red subpixel, the green subpixel and the blue subpixel.

Each of the subpixels SP supplies a predetermined or selected current to the organic light emitting element in accordance with a data voltage of the data line when a gate signal is input from the gate line by using the thin film transistor. For this reason, the light emitting portion of each of the subpixels may emit light with a predetermined or selected brightness in accordance with the predetermined or selected current. A structure of each of the subpixels SP will be described later with reference to FIG. 4.

The non-display area NDA may be an area where an image is not displayed, and may be a peripheral circuit area, a signal supply area, a non-active area, or a bezel area. The non-display area NDA may be configured to be around the display area DA. That is, the non-display area NDA may be disposed to be adjacent to, surround, laterally surround or at other locations relative to the display area DA.

The transparent display apparatus 100 according to one embodiment of the present disclosure may include a second transmissive portion TR2 provided in the non-display area NDA.

The second transmissive portion TR2 is an area provided to allow light to transmit through the front and rear surfaces of the display panel DP like the first transmissive portion TR1. Therefore, a user located in the direction of the front surface of the display panel DP may view an image or background positioned in the direction of the rear surface of the display panel DP even through the second transmissive portion TR2 provided in the non-display area NDA.

As a result, since the transparent display apparatus 100 according to one embodiment of the present disclosure may transmit an image or background disposed in the direction of the front surface or the rear surface of the display panel DP through the first transmissive portion TR1 provided in the display area DA and the second transmissive portion TR2 provided in the non-display area NDA, light transmittance may be more improved than the case that the transmissive portion is provided only in the display area. In addition, in the transparent display apparatus 100 according to one embodiment of the present disclosure, as the second transmissive portion TR2 is provided in the non-display area NDA in the same manner that the first transmissive portion TR1 is provided in the display area DA, the display area DA and the non-display area NDA are provided in a similar structure, whereby a difference in visual appearance between the display area DA and the non-display area NDA may be reduced, and thus characteristics of visual appearance of the entire screen may be prevented from being deteriorated.

Referring back to FIG. 3, the non-display area NDA may be disposed at an edge portion of the display panel DP. The non-display area NDA according to an example may include first, second, third and fourth non-display areas disposed at an edge portion of the first substrate 110. For example, the non-display area NDA may include a first non-display area disposed on or being in contact with a first side of the display area DA, a second non-display area disposed on or being in contact with a second side of the display area DA, a third non-display area disposed on or being in contact with a third side of the display area DA, which is parallel with the second side of the display area DA, and a fourth non-display area disposed on or being in contact with a fourth side of the display area DA, which is parallel with the first side of the display area DA. For example, each of the first and fourth non-display areas may be parallel with a first direction X, and each of the second and third non-display areas may be parallel with a second direction Y crossing (or perpendicular to) the first direction X.

Any one of the non-display areas NDA may include a pad area PA. The pad area PA may be disposed on at least one of the first, second third or fourth non-display areas exposed to the outside without being covered by the second substrate 120 of the non-display area NDA. For example, the pad area may be disposed in the first non-display area. In this case, as shown in FIG. 3, the gate driver GD may be disposed in the second and third non-display areas. A power sharing line for supplying a power source to the display area DA may be disposed in the fourth non-display area. The fourth non-display area may be a non-pad portion NP in which the pad area PA is not disposed.

A plurality of pads (not shown) may be disposed to be spaced apart from each other along the first direction X in the pad area PA. Each of the plurality of pads may include a plurality of data pads, at least one pixel driving power pad, and a plurality of common power pads.

The gate driver GD supplies gate signals to the gate lines in accordance with the gate control signal input from the timing controller 160. The gate driver GD may be formed on one side of the display area DA of the display panel DP or on the non-display area NDA outside both sides of the display area DA in a gate driver in panel (GIP) method as shown in FIG. 3. Alternatively, the gate driver GD may be manufactured as a driving chip, packaged in a flexible film and attached to the non-display area NDA outside one side or both sides of the display area DA of the display panel DP by a tape automated bonding (TAB) method. The gate driver GD may include a plurality of gate driving circuits. Hereinafter, the non-display area NDA in which the gate driver GD is included may be referred to as a GIP area GDA (shown in FIG. 6). The GIP area GDA may include a plurality of GIP portions 200 and a plurality of GIP lines 210.

The plurality of gate driving circuits may be divisionally disposed on a left side of the display area DA, that is, the second non-display area, and on a right side of the display area DA, that is, the GIP area GDA of each of the third non-display areas. According to an example, the gate driving circuit disposed in the second non-display area may be electrically connected to each of the gate lines disposed in the display area DA, and the gate driving circuit disposed in the third non-display area may be electrically connected to each of the gate lines disposed in the display area DA. For example, the gate driving circuit of the second non-display area may be connected to one side of each of the gate lines, and the gate driving circuit of the third non-display area may be connected to the other side of each of the gate lines.

According to another example, the gate driving circuit of the second non-display area may be electrically connected to each of the odd-numbered (or even-numbered) gate lines of the gate lines disposed in the display area DA, and the gate driving circuit of the third non-display area may be electrically connected to each of the even-numbered (or odd-numbered) gate lines of the gate lines disposed in the display area DA. For example, the gate driving circuit of the second non-display area may be connected to one side of each of the odd-numbered gate lines, and the gate driving circuit of the third non-display area may be connected to the other side of each of the even-numbered gate lines.

The plurality of gate driving circuits may output gate control signals supplied from the plurality of pads and gate signals sequentially shifted based on gate circuit driving power sources. To this end, each of the plurality of gate driving circuits may include a plurality of GIP portions 200 (shown in FIG. 6). The GIP portion 200 according to an example may be a thin film transistor of the gate driver GD, and may be referred to as a thin film transistor 200.

The plurality of GIP portions 200 according to an example may be disposed to surround the second transmissive portion TR2. For example, as shown in FIGS. 6 and 7, two or more of the plurality of GIP portions 200 may be disposed to adjacent to, surround, laterally surround, or be located relative to the second transmissive portion TR2 while being adjacent to the second transmissive portion TR2. The transparent display apparatus 100 according to one embodiment of the present disclosure is disposed so that the second transmissive portion TR2 does not overlap the plurality of GIP portions 200, whereby light transmittance of the second transmissive portion TR2 may be further improved.

The plurality of GIP portions 200 may have a structure similar to that of the thin film transistor 112 of the pixel P. Therefore, the description of the plurality of GIP portions 200 will be described in conjunction with the description of the thin film transistor 112 of the pixel P.

Referring back to FIG. 2, the source drive IC 130 receives digital video data and a source control signal from the timing controller 160. The source drive IC 130 converts the digital video data into analog data voltages in accordance with the source control signal and supplies the analog data voltages to the data lines. When the source drive IC 130 is manufactured as a driving chip, the source drive IC 130 may be packaged in the flexible film 140 in a chip on film (COF) method or a chip on plastic (COP) method.

Pads, such as data pads, may be formed in the non-display area NDA of the display panel DP. Lines connecting the pads with the source drive IC 130 and lines connecting the pads with lines of the circuit board 150 may be formed in the flexible film 140. The flexible film 140 may be attached onto the pads by using an anisotropic conducting film, whereby the pads may be connected with the lines of the flexible film 140.

The circuit board 150 may be attached to the flexible films 140. A plurality of circuits implemented as driving chips may be packaged in the circuit board 150. For example, the timing controller 160 may be packaged in the circuit board 150. The circuit board 150 may be a printed circuit board or a flexible printed circuit board.

The timing controller 160 receives the digital video data and a timing signal from an external system board through a cable of the circuit board 150. The timing controller 160 generates a gate control signal for controlling an operation timing of the gate driver GD and a source control signal for controlling the source drive ICs 130 based on the timing signal. The timing controller 160 supplies the gate control signal to the gate driver GD, and supplies the source control signal to the source drive ICs 130.

Referring to FIG. 3, the first transmissive portion TR1 may be disposed to be adjacent to at least a portion of the plurality of subpixels SP, and may be included in one pixel P. Since the plurality of pixels P are provided in the display area DA, a plurality of the first transmissive portions TR1 may be provided in the display area DA. Although the first transmissive portion TR1 is illustrated as being provided in a rectangular shape in FIG. 3, the first transmissive portion TR1 is not limited thereto. The first transmissive portion TR1 may be provided in various shapes. For example, the first transmissive portion TR1 may be provided in a form including a concave portion CP and a convex portion PP, in the same manner as the second transmissive portion TR2 shown in FIG. 5.

Likewise, the second transmissive portion TR2 according to an example may be provided in the same form as that of the first transmissive portion TR1. In this case, the same form means the same shape, and is not intended to mean the same size (or area). However, the present disclosure is not necessarily limited to this example, and the second transmissive portion TR2 may be provided not only in the same shape but also in the same size (or area) as that of the first transmissive portion TR1.

The transparent display apparatus 100 according to one embodiment of the present disclosure is provided such that the second transmissive portion TR2 is disposed in the non-display area NDA, so that overall light transmittance may be improved, and a difference in visual appearance between the display area DA and the non-display area NDA may be reduced. In more detail, since the first transmissive portion TR1 of each of the plurality of pixels P is disposed in the display area DA and the second transmissive portion TR2 is disposed in the non-display area NDA, transmittance of the transparent display apparatus 100 may be improved and the difference in visual appearance between the display area DA and the non-display area NDA may be reduced. Therefore, a user located in the direction of the front surface of the transparent display apparatus 100 according to one embodiment of the present disclosure may view a background or image positioned in the direction of the rear surface of the transparent display apparatus 100 without a gap between the display area DA and the non-display area NDA.

In addition, in the transparent display apparatus 100 according to one embodiment of the present disclosure, as the second transmissive portion TR2 is provided to have the same shape as that of the first transmissive portion TR1, the display area DA and the non-display area NDA may be formed in a similar structure to further reduce the difference in visual appearance therebetween, whereby a user may more integrally view a background or image through the display area DA and the non-display area NDA.

Hereinafter, a subpixel SP of the display apparatus 100 according to one embodiment of the present disclosure will be described with reference to FIGS. 3 and 4.

Referring to FIG. 4, the display apparatus 100 according to one embodiment of the present disclosure may include a buffer layer BL disposed on the first substrate 110, preventing water from being permeated into the thin film transistor 112.

In addition, each of the subpixels SP according to one embodiment of the present disclosure may include a circuit element layer 111 provided on an upper surface of the buffer layer BL, including a gate insulating layer 111a, an interlayer insulating layer 111b, a protective layer 111c, and a thin film transistor 112, a planarization layer 113 provided on the circuit element layer 111, a first electrode 114 provided on the planarization layer 113, a bank 115, an organic light emitting layer 116, a second electrode 117, a capping layer 118, and an encapsulation layer 119. The first electrode 114, the organic light emitting layer 116, and the second electrode 117 may be included in the light emitting element.

The buffer layer BL may be formed between the first substrate 110 and the gate insulating layer 111a to protect the thin film transistor 112. The buffer layer BL may be disposed entirely on one surface (or front surface) of the first substrate 110. The buffer layer BL may serve to prevent a material contained in the first substrate 110 from being diffused into a transistor layer during a high temperature process of the manufacturing process of the thin film transistor. Optionally, the buffer layer BL may be omitted as the case may be.

The circuit element layer 111 may include a gate insulating layer 111a, an interlayer insulating layer 111b, a protective layer 111c, and a thin film transistor 112.

The thin film transistor 112 according to an example may include an active layer 112a, a gate electrode 112b, a source electrode 112c, and a drain electrode 112d.

The active layer 112a may include a channel area, a drain area and a source area, which are formed in a thin film transistor area of a circuit area of the pixel P. The drain area and the source area may be spaced apart from each other with the channel area interposed therebetween.

The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the buffer layer BL, which includes the active layer 112a.

The gate electrode 112b may be formed on the gate insulating layer 111a to overlap the channel area of the active layer 112a.

The interlayer insulating layer 111b may be formed on the gate electrode 112b and the drain area and the source area of the active layer 112a. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112a through a source contact hole provided in the interlayer insulating layer 111b overlapped with the source area of the active layer 112a.

The drain electrode 112d may be electrically connected to the drain area of the active layer 112a through a drain contact hole provided in the interlayer insulating layer 111b overlapped with the drain area of the active layer 112a.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor may be provided in an overlap area between the gate electrode 112b and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the first substrate 110 may further include a light shielding layer (not shown) provided below the active layer 112a of at least one of the thin film transistor 112, the first switching thin film transistor or the second switching thin film transistor. The light shielding layer may be disposed between the first substrate 110 and the active layer 112a to shield light incident on the active layer 112a through the first substrate 110, thereby minimizing a change in the threshold voltage of the transistor due to external light.

The protective layer 111c may be provided on the first substrate 110 to cover the pixel area. The protective layer 111c covers the drain electrode 112d and the source electrode 112c of the thin film transistor 112 and the interlayer insulating layer 111b. The protective layer 111c may be entirely formed in the circuit area and the light emission area. For example, the protective layer 111c may be expressed as a passivation layer. The protective layer 111c may be omitted.

The gate insulating layer 111a, the interlayer insulating layer 111b, and the protective layer 111c may be included in an inorganic layer made of an inorganic material.

The planarization layer 113 may be formed on the first substrate 110 to cover the protective layer 111c. When the protective layer 111c is omitted, the planarization layer 113 may be provided on the first substrate 110 to cover the circuit area. The planarization layer 113 may be formed entirely in the circuit area and the light emission area. In addition, the planarization layer 113 may be formed on the other area except the pad area PA in the non-display area NDA and the entire display area DA. For example, the planarization layer 113 may include an extension portion (or enlarged portion) extended or enlarged from the display area DA to the other non-display area NDA except the pad area PA. Therefore, the planarization layer 113 may have a size relatively wider than that of the display area DA. Referring to FIG. 6, the planarization layer 113 may be disposed even in the non-display area NDA. Since the planarization layer 113 disposed in the non-display area NDA is made of the same material as that of the planarization layer 113 provided in the display area DA, the visibility difference between the non-display area NDA and the display area DA may be reduced.

The planarization layer 113 according to an example may be formed to be relatively thick, and thus may provide a flat surface on the display area DA and the non-display area NDA. For example, the planarization layer 113 may be made of an organic material such as photo acryl, benzocyclobutene, polyimide, and fluorine resin.

Meanwhile, the GIP portion 200 disposed to adjacent to or surround the second transmissive portion TR2, that is, the GIP portion 200 positioned in the GIP area GDA of the non-display area NDA may be provided in a similar structure to that of each of the active layer 112a of the thin film transistor 112 of the pixel P described above, the gate electrode 112b disposed on the gate insulating layer 111a covering the active layer 112a, and the drain electrode 112d and the source electrode 112c, which are disposed on the interlayer insulating layer 111b covering the gate electrode 112b.

Therefore, as shown in FIG. 7, the GIP portion 200 positioned in the GIP area GDA may include an active layer 200a, a gate electrode 200b disposed on the gate insulating layer 111a covering the active layer 200a, and a drain electrode 200d and a source electrode 200c, which are disposed on the interlayer insulating layer 111b covering the gate electrode 200b.

As shown in FIG. 7, a protective layer 111c may be disposed on the source electrode 200c and the drain electrode 200d of the GIP portion 200, and a planarization layer 113 may be disposed on the protective layer 111c.

In the subpixel SP of FIG. 4, the first electrode 114 is connected to the drain electrode 112d of the thin film transistor 112 through a contact hole formed in the planarization layer 113 and the protective layer 111c, but in the non-display area NDA of FIG. 7, the drain electrode 200d of the GIP portion 200 is not connected to the first electrode (or pattern electrode) provided on the planarization layer 113 of the non-display area NDA. This is because the organic light emitting layer 116 does not emit light in the non-display area NDA.

Referring back to FIG. 4, the first electrode 114 may be formed on the planarization layer 113. The first electrode 114 is connected to the drain electrode or the source electrode of the thin film transistor 112 through a contact hole that passes through the planarization layer 113 and the protective layer 111c.

The first electrode 114 may be made of at least one of a transparent metal material, a semi-transmissive metal material, or a metal material having high reflectance.

When the transparent display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and indium tin oxide (ITO), an Ag alloy, and a stacked structure (ITO/Ag alloy/ITO) of Ag alloy and ITO. The Ag alloy may be an alloy such as silver (Ag), palladium (Pd), and copper (Cu).

When the transparent display apparatus 100 is provided in a bottom emission mode, the first electrode 114 may be formed of a transparent conductive material (TCO) such as ITO and indium zinc oxide (IZO), which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be an anode electrode.

The bank 115 is a non-light emission area in which light is not emitted, and may be provided to be adjacent to each of light emission areas (or light emitting portions) of the plurality of subpixels SP. That is, the bank 115 may partition (or define) the respective light emission areas (or light emitting portions).

The bank 115 may be formed on the planarization layer 113 to cover an edge of the first electrode 114, thereby partitioning (or defining) the light emission areas (or light emitting portions) of the plurality of subpixels SP.

The bank 115 may be formed to cover the edge of the first electrode 114 of each of the subpixels SP and expose a portion of each of the first electrodes 114. Therefore, a current is concentrated on an end of each of the first electrodes 114 to avoid a problem in which light emitting efficiency is degraded. An exposed portion of the first electrode 114 that is not covered by the bank 115 may be a light emission area (or light emitting portion).

The bank 115 may be formed of an organic layer such as an acrylic resin, an epoxy resin, a phenolic resin, a polyamide resin, and a polyimide resin, but is not limited thereto.

The organic light emitting layer 116 is formed on the first electrode 114 and the bank 115. When a voltage is applied to the first electrode 114 and the second electrode 117, holes and electrons move to the organic light emitting layer 116, respectively, and are combined with each other in the organic light emitting layer 116 to emit light.

The organic light emitting layer 116 may be formed of a plurality of subpixels SP and a common layer provided on the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the first electrode 114 and the second electrode 117.

A color filter (not shown) suitable for a color of a corresponding subpixel SP may be formed on the second substrate 120. For example, a red color filter may be provided in a red subpixel, a green color filter may be provided in a green subpixel, and a blue color filter may be provided in a blue subpixel. A white subpixel may not include a color filter because the organic light emitting layer 116 emits white light.

However, the present disclosure is not limited to the above example, and the organic light emitting layer 116 may include a red light emitting layer for emitting red light from the first subpixel, a green light emitting layer for emitting green light from the second subpixel, a blue light emitting layer for emitting blue light from the third subpixel, and a white light emitting layer for emitting white light from the fourth subpixel, without being provided as a common layer. In this case, since the organic light emitting layer 116 is provided to emit light of colors different for each of the subpixels SP, a color filter may not be formed on the second substrate 120.

The second electrode 117 is formed on the organic light emitting layer 116. The second electrode 117 may be a common layer commonly formed in the subpixels SP. The second electrode 117 may be made of a transparent metal material, a semi-transmissive metal material or a metal material having high reflectance.

When the transparent display apparatus 100 is provided in a top emission mode, the second electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the transparent display apparatus 100 is provided in a bottom emission mode, the second electrode 117 may be formed of a metal material having high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. The second electrode 117 may be a cathode electrode.

The capping layer 118 may be formed on the second electrode 117 but may be omitted. When the capping layer 118 is formed, the capping layer 118 may be formed entirely in the display area DA. In this case, the capping layer 118 may be partially disposed in the non-display area NDA to reduce the difference in visual appearance between the non-display area and the display area DA.

The encapsulation layer 119 is formed on the capping layer 118. The encapsulation layer 119 serves to prevent oxygen or water from being permeated into the organic light emitting layer 116 and the second electrode 117. To this end, the encapsulation layer 119 may include at least one inorganic layer.

In the display apparatus 100 according to one embodiment of the present disclosure, the encapsulation layer 119 may be disposed in the non-display area NDA as well as the display area DA as shown in FIG. 6. The encapsulation layer 119 according to an example may be disposed between a transparent filling member TF and the capping layer 118 in the display area DA, and may be disposed between the capping layer 118 disposed on the buffer layer BL and a transparent connection member TD, and between the first substrate 110 and the transparent connection member TD and between the disconnected (or discontinuous) capping layer 118 and the transparent connection member TD in the non-display area NDA. The disconnected capping layer 118 may be disposed on the organic light emitting layer 116 disconnected from the second transmissive portion TR2. Therefore, as shown in FIG. 6, the disconnected (or discontinuous) organic light emitting layer 116 and the disconnected (or discontinuous) capping layer 118 may be disposed in the second transmissive portion TR2. Therefore, the encapsulation layer 119 may overlap the first transmissive portion TR1 in the display area DA, and may overlap the second transmissive portion TR2 in the non-display area NDA.

Meanwhile, since the encapsulation layer 119 is disposed in the display area DA and extended to the non-display area NDA, the encapsulation layer 119 may be in contact with at least a portion of a side of a dam DAM (or lower dam DAM2) in an outer portion of the display panel DP. Therefore, the transparent display apparatus 100 according to one embodiment of the present disclosure may effectively prevent water permeation from the outside of the display panel DP toward the display area DA.

However, the encapsulation layer 119 is not limited to the above example. The encapsulation layer 119 may be extended to a portion of the non-display area NDA, and may be provided only in the display area DA without being provided in the non-display area NDA. Hereinafter, a case that the encapsulation layer 119 is disposed in the display area DA and extended to the entire non-display area NDA will be described as an example.

As shown in FIG. 6, the encapsulation layer 119 may be in contact with the transparent filling member TF in the display area DA, and may be in contact with the transparent connection member TD in the non-display area NDA. Therefore, the encapsulation layer 119 according to an example may be made of a material having a large adhesive force to at least one of the transparent filling member TF or the transparent connection member TD in order to increase the overall coupling force between the first substrate 110 and the second substrate 120.

As a result, the transparent display apparatus 100 according to one embodiment of the present disclosure may have a structural characteristic that includes a second transmissive portion TR2 overlapped with the transparent connection member TD in the GIP area GDA of the non-display area NDA, and a first transmissive portion TR1 overlapped with the transparent filling member TF in the display area DA.

Referring back to FIG. 5, the second transmissive portion TR2 may include at least one concave portion CP and at least one convex portion PP on the periphery.

The concave portion CP and the convex portion PP are intended to reduce or prevent haze of a background or image that has transmitted through the second transmissive portion TR2 when the background or image positioned on the front or rear surface of the display panel DP transmits through the second transmissive portion TR2 and is visible to a user located in the direction of an opposite side of the display panel DP.

For example, when the transmissive portion is provided in a rectangular shape, since the transmissive portion is adjacent to or surrounded by any one of an encapsulation layer, a planarization layer and a first electrode, which are provided in four adjacent linear shapes, haze may be greatly generated, whereby a background or image may be viewed to be blurred. However, in the transparent display apparatus 100 according to one embodiment of the present disclosure, the second transmissive portion TR2 is provided to include at least one concave portion CP and at least one convex portion PP along the periphery so that haze may be reduced to allow a background or image to be clearly viewed.

The concave portion CP may be provided such that a mask used for a process of forming the second transmissive portion TR2, for example, a mask used for patterning the planarization layer 113 in FIG. 7 includes a concave shape, whereby the planarization layer 113 may be patterned in a concave shape.

The convex portion PP may be provided such that the mask used for a process of forming the second transmissive portion TR2, for example, a mask used for patterning the planarization layer 113 in FIG. 7 includes a convex shape, whereby the planarization layer 113 may be patterned in a convex shape. The convex portion PP may be disposed to be adjacent to the concave portion CP.

As shown in FIG. 5, since the plurality of concave portions CP and the plurality of convex portions PP may be formed along the second direction Y, the second transmissive portion TR2 may have different widths in the first direction X, but is not limited thereto. The concave portion CP and the convex portion PP may be provided to extend along the entire lateral periphery of the entire second transmissive portion TR2. In this case, the second transmissive portion TR2 may be provided to have widths different from each other in the first direction X and the second direction Y. In addition, the plurality of concave portions CP and the plurality of convex portions PP of the second transmissive portion TR2 may be formed along the first direction X. In this case, the second transmissive portion TR2 may have widths different from each other in the second direction Y.

The concave portion CP may be formed in a semicircular shape that includes a curved surface as shown in FIG. 5, but is not limited thereto. The concave portion CP may be formed in various shapes such as '⊏' (e.g., an open rectangular shape), '<' (e.g., an open triangular shape), '⊂' (e.g., an open ovular or "C" shape) or rotated shapes of '⊏', '<' and '⊂' if haze may be reduced. The convex portion PP may be formed in a shape that is opposite to that of the concave portion CP, but is not limited thereto. The convex portion PP may be formed in various shapes.

As shown in FIG. 5, the second transmissive portion TR2 may be formed in a rectangular shape having a plurality of concave portions CP and a plurality of convex portions PP, but is not limited thereto. The second transmissive portion TR2 may be formed in other shapes such as a hexagonal shape, a circular shape, or the like when haze may be reduced or avoided. As the second transmissive portion TR2 is provided in a shape close to a circular shape, directionality in which light is spread is reduced, whereby haze may be more significantly reduced or avoided. The transparent display apparatus 100 according to one embodiment of the present disclosure has been described that the second transmissive portion TR2 is provided in a rectangular shape having a plurality of concave portions CP and a plurality of convex portions PP by way of example, and the effect will be described later in more detail with reference to FIGS. 9a and 9b.

Referring to FIG. 6, the transparent display apparatus 100 according to one embodiment of the present disclosure may further include a transparent connection member TD and a transparent filling member TF.

The transparent connection member TD may be disposed between the first substrate 110 and the second substrate 120. Therefore, the first substrate 110 and the second substrate 120 may be bonded to each other by means of the transparent connection member TD. For example, the transparent connection member TD may include a thermosetting transparent adhesive or a light curable transparent adhesive. The transparent connection member TD may contain an absorbing material (not shown) for absorbing external water or moisture that is permeated into the display area DA.

The transparent connection member TD may adjacent to or surround (e.g., laterally surround) the display area DA, and may be directly in contact with the encapsulation layer 119 disposed in the non-display area NDA. Also, as shown in FIG. 6, the transparent connection member TD may be disposed in the non-display area NDA to overlap the second transmissive portion TR2.

The second transmissive portion TR2 according to an example may be formed by removing the inorganic layer provided between the first substrate 110 and the encapsulation layer 119. As the second transmissive portion TR2 and the transparent connection member TD may be disposed to overlap each other, light transmittance in the non-display area NDA may be improved.

Meanwhile, the display apparatus 100 according to one embodiment of the present disclosure may further include a dam DAM for preventing the transparent connection member TD provided in the non-display area NDA from overflowing toward the outside of the display panel DP.

The dam DAM is for covering the transparent connection member TD so that the transparent connection member TD does not flow to the outside of the display panel DP (or second substrate 120) in the non-display area NDA. As the dam DAM is formed to be protruded in a direction in which the first substrate 110 and the second substrate 120 are bonded to each other, the dam DAM may prevent the transparent connection member TD from overflowing to the outside of the display panel DP by partially or fully blocking the edge of the transparent connection member TD. The dam DAM may be made of an inorganic material to prevent water permeation, but is not limited thereto.

The dam DAM according to an example may include an upper dam DAM1 and a lower dam DAM2, which are at least partially disposed between an end of the display panel DP and the GIP area GDA. The upper dam DAM1 may be formed to be protruded from one surface of the second substrate 120, which faces the first substrate 110, toward the first substrate 110. The lower dam DAM2 may be formed to be protruded from one surface of the first substrate 110, which faces the second substrate 120, toward the second substrate 120. Therefore, the upper dam DAM1 and the lower dam DAM2 may prevent the transparent connection member TD from flowing from the non-display area NDA (or GIP area GDA) toward the end of the display panel DP.

As shown in FIG. 6, the lower dam DAM2 may include a planarization layer 113 and a dam bank DB. The planarization layer 113 of the lower dam DAM2 according to an example may be thicker than the planarization layer 113 disposed in the GIP area GDA because the GIP portion 200 of the GIP area GDA is not provided below the planarization layer 113, but the present disclosure is not limited thereto. The lower dam DAM2 may include an outer pattern (not shown) made of a material similar to that of the metal material of the GIP portion 200 below the planarization layer 113. In this case, the lower dam DAM2 may be provided in a triple stacked structure having the outer pattern, the planarization layer 113 disposed on an upper surface of the outer pattern and the dam bank DB disposed on an upper surface of the planarization layer 113. The reason why the outer pattern is formed on the lower dam DAM2 is to reduce the difference in visual appearance between the non-display area NDA and the display area DA as the overall structure of the lower dam DAM2 is provided to be similar to the structure of the subpixel SP provided in the display area DA. The lower dam DAM2 according to another example may further include a first electrode (or pattern electrode) between the dam bank DB and the planarization layer 113. The pattern electrode may be provided between the dam bank DB of the non-display area NDA and the planarization layer 113 in order to reduce the visibility difference with the display area DA. In this case, the lower dam DAM2 may have a four-layered stacked structure having the outer pattern, the planarization layer 113 disposed on the upper surface of the outer pattern, the pattern electrode disposed on the upper surface of the planarization layer 113, and the dam bank DB disposed on an upper surface of the pattern electrode.

As described above, when the lower dam DAM2 is provided in a triple stacked structure, a thickness of the planarization layer 113 of the lower dam DAM2 may be the same as or similar to that of the planarization layer 113 disposed in the GIP area GDA, however the present disclosure is not limited thereto. When the lower dam DAM2 is provided in a four-layered stacked structure, the thickness of the planarization layer 113 of the lower dam DAM2 may be thinner than that of the planarization layer 113 disposed in the GIP area GDA. Hereinafter, as shown in FIG. 6, the lower dam DAM2 provided in a double stacked structure having a planarization layer 113 and a dam bank DB will be described by way of example.

The dam bank DB of the lower dam DAM2 may be disposed on the upper surface of the planarization layer 113 of the lower dam DAM2 so that the overall thickness (or height) of the lower dam DAM2 may become thicker (or higher). Therefore, as the lower dam DAM2 is provided to be higher than a height of the encapsulation layer 119 disposed in the GIP area GDA, the transparent connection member TD may be prevented from overflowing from the GIP area GDA to the outside of the display panel DP. As shown in FIG. 6, the lower dam DAM2 may be in contact with a portion of the edge of the transparent connection member TD disposed on the encapsulation layer 119 at the end of the GIP area GDA.

Although the upper dam DAM1 is illustrated as being provided as a single layer, the upper dam DAM1 may be provided as a plurality of layers having a planarization layer and a dam bank, like the lower dam DAM2, in order to more effectively prevent the transparent connection member TD from overflowing. When the upper dam DAM1 is provided as a plurality of layers, the dam bank may be disposed to face the dam bank DB of the lower dam DAM2. As another example, the planarization layer of the upper dam DAM1 may be positioned between the dam bank of the upper dam DAM1 and the dam bank DB of the lower dam DAM2.

Meanwhile, when the upper dam DAM1 is provided as a single layer as shown in FIG. 6, the upper dam DAM1 may be made of an organic material the same as that of the planarization layer 113, but is not limited thereto. The upper dam DAM1 may be made of an inorganic material. When the upper dam DAM1 is made of an organic material, since an adhesive force with the transparent connection member TD may be improved, the first substrate 110 and the second substrate 120 may be further prevented from being separated from each other by an external force.

The display apparatus 100 according to one embodiment of the present disclosure may further include a transparent filling member TF.

The transparent filling member TF may be disposed to be adjacent to the transparent connection member TD in the display area DA. The transparent filling member TF may be disposed to fill a gap between the first substrate 110 and the second substrate 120, which are disposed in the display area DA, thereby supporting the first substrate 110 and the second substrate 120. Therefore, the transparent filling member TF may prevent the first substrate 110 and the second substrate 120, which are disposed in the display area DA, from being easily deformed by an external force. In addition, the transparent filling member TF may be provided to be disposed between the organic light emitting layer 116 formed in the first substrate 110 and the second substrate 120, thereby preventing external water or moisture permeated through the second substrate 120 from reaching the organic light emitting layer 116. That is, the transparent filling member TF may have a barrier function to block water permeation. The transparent fill member TF may further contain an absorbing material for absorbing water or moisture to enhance a moisture permeation prevention effect. For example, the absorbing material may be a getter material.

Meanwhile, the transparent fill member TF may include a thermosetting transparent adhesive or a light curable transparent adhesive. In this case, the transparent filling member TF may be used to bond the first substrate 110 and the second substrate 120 to each other together with the transparent connection member TD. Therefore, a bonding force between the first substrate 110 and the second substrate 120 may be more improved.

The transparent filling member TF may be adjacent to or surrounded (e.g., laterally surrounded) by the transparent connection member TD, and may be directly in contact with the encapsulation layer 119 disposed in the display area DA. The transparent filling member TF may be disposed in the display area DA to overlap the first transmissive portion TR1.

When the inorganic layer is removed from the second transmissive portion TR2, the inorganic layer provided between the first substrate 110 of the display area DA and the encapsulation layer 119 may be removed, whereby the first transmissive portion TR1 according to an example may be formed. As the first transmissive portion TR1 from which such an inorganic layer is removed and the transparent filling member TF are disposed to overlap each other, light transmittance in the display area DA may be improved.

Also, as described above, when the transparent filling member TF contains an absorbing material, a haze phenomenon may occur due to the absorbing material. However, in the transparent display apparatus 100 according to one embodiment of the present disclosure, since the inorganic layer disposed below the first transmissive portion TR1 of the display area DA is removed, light transmittance may be improved, whereby the haze phenomenon may be avoided or reduced.

Meanwhile, as the non-display area NDA is provided in the same structure as that of the display area DA, the visibility difference between the non-display area NDA and the display area DA may be gradually reduced. Therefore, in the transparent display apparatus 100 according to one embodiment of the present disclosure, the organic light emitting layer 116 provided in the display area DA may be provided even in the non-display area NDA so that the difference in visual appearance between the display area DA and the non-display area NDA may be further reduced.

In more detail, as shown in FIG. 6, the organic light emitting layer 116 may be disposed to be extended to the non-display area NDA in which the second transmissive portion TR2 is disposed. However, when the organic light emitting layer 116 is provided in a single connected (or continuous) shape without being disconnected between the display area DA and the non-display area NDA, external water or moisture may permeate into the display area DA through the organic light emitting layer 116 disposed to be adjacent to the outside (or disposed in the non-display area NDA), whereby the organic light emitting layer 116 disposed in the display area DA may be damaged.

Therefore, as shown in FIGS. 6 and 7, in the transparent display apparatus 100 according to one embodiment of the present disclosure, as the organic light emitting layer 116 is provided to be disconnected from the second transmissive portion TR2, external water or moisture may be prevented from being permeated into the display area DA through the organic light emitting layer 116, whereby reliability of moisture permeation prevention may be improved.

Also, in the transparent display apparatus 100 according to one embodiment of the present disclosure, since the planarization layer 113 may be disconnected by the plurality of second transmissive portions TR2 as shown in FIGS. 6 and 7, moisture permeation through the planarization layer 113 may be avoided and thus a moisture permeation prevention effect may be increased or maximized.

FIG. 7 shows that the organic light emitting layer 116 is disconnected in the non-display area NDA, and FIG. 7 is a schematic enlarged view of a portion B of FIG. 6.

As shown in FIG. 7, the organic light emitting layer 116 disposed in the non-display area NDA may be disconnected from the edge of the second transmissive portion TR2. In order to disconnect the organic light emitting layer 116 from the edge of the second transmissive portion TR2, the transparent display apparatus 100 according to one embodiment of the present disclosure may further include an undercut portion UC.

The undercut portion UC may be disposed between the first substrate 110 and the planarization layer 113 disposed on the plurality of gate driving circuits. The undercut portion UC according to an example may be formed by removing at least a portion of the plurality of inorganic layers disposed in the second transmissive portion TR2 (or between the first substrate 110 and the planarization layer 113). For example, the undercut portion UC may be formed by removing the buffer layer BL, the gate insulating layer 111a, the interlayer insulating layer 111b and the protective layer 111c, which are disposed between the first substrate 110 and the planarization layer 113, from the second transmissive portion TR2 (or GIP area GDA). After the first electrode 114 and the bank 115 are formed on the planarization layer 113, the bank 115 and the planarization layer 113, which are disposed in the second transmissive portion TR2, are primarily removed through an exposure process and a dry etching process using a photoresist and a mask, and then the inorganic layers disposed in the second transmissive portion TR2, that is, the buffer layer BL, the gate insulating layer 111a, the interlayer insulating layer 111b and the protective layer 111c may be secondarily removed by a high concentration etchant. For example, the high concentration etchant may be a material capable of etching an inorganic layer such as $SiO_2$, and for example, may be a solution in which a neutral ammonium fluoride ($NH_4F$) and a buffered oxide etch (BOE) solution are mixed at a ratio of 6:1. The high concentration etchant may be in contact with the inorganic layers disposed in the second transmissive portion TR2 for about 20 seconds to 50 seconds, preferably 40 seconds, whereby at least some of the inorganic layers disposed in the second transmissive portion TR2 may be removed. Through the above-described process, the undercut portion UC having a predetermined or selected width W and a height H may be formed below the planarization layer 113 of the non-display area NDA (or GIP area GDA). In a subsequent process, the organic light emitting layer 116 formed entirely on the display area DA and the non-display area NDA may be disconnected from the undercut portion UC having a predetermined or selected width W and a height H. The undercut portion UC may be disposed along the edge of the second transmissive portion TR2. The organic light emitting layer 116 may have segments (e.g., three segments shown in FIG. 7) that are disconnected from each other by the undercut portion UC. The inorganic layers may have segments (e.g., two segments shown in FIG. 7) that are disconnected from each other by the undercut portion UC.

The width W of the undercut portion UC may be 0.1 micrometers to 5 micrometers (μm). In this case, as shown in FIG. 7, the width W of the undercut portion UC may mean the shortest distance between the end of the planarization layer 113 and the end of the protective layer 111c exposed by the high concentration etchant, which are closest to each other with the second transmissive portion TR2 interposed therebetween.

When the width W of the undercut portion UC is less than 0.1 μm, the organic light emitting layer 116 may not be disconnected (e.g., completely disconnected), and when the width W of the undercut portion UC exceeds 5 μm, the encapsulation layer 119 may be disconnected without covering the undercut portion UC. When the encapsulation layer 119 is disconnected, at least one of the organic light emitting layer 116 or the planarization layer 113 may be exposed through the disconnected gap, and water may be permeated through the exposed organic light emitting layer 116 and planarization layer 113, whereby reliability may be deteriorated.

The height H of the undercut portion UC may be 0.3 μm to 1.3 μm. In this case, the height H of the undercut portion UC may mean the shortest distance between the end of the planarization layer 113 and the upper surface of the first substrate 110 exposed by the high concentration etchant, which are closest to each other with the second transmissive portion TR2 interposed therebetween. In FIG. 7, since the buffer layer BL is removed by the high concentration etchant, the upper surface of the first substrate 110 may be a reference point of the height H of the undercut portion UC. However, when the gate insulating layer 111a, the interlayer insulating layer 111b and the protective layer 111c are removed by the high concentration etchant without removing the buffer layer BL, the reference point of the height H of the undercut portion UC may be an upper surface of the buffer layer BL.

When the height H of the undercut portion UC is less than 0.3 μm, the organic light emitting layer 116 may not be disconnected (e.g., completely disconnected), and when the height H of the undercut portion UC exceeds 1.3 μm, the inorganic layer that covers the GIP portion 200 or the lower line, for example, the GIP line near the second transmissive portion TR2 may be removed by the high concentration etchant within a greater range. Therefore, the GIP portion 200 or the lower line may be exposed without being covered by the inorganic layer, and thus may be damaged by the high concentration etchant.

Therefore, in the transparent display apparatus 100 according to one embodiment of the present disclosure, as the width W of the undercut portion UC is 0.1 μm to 5 μm, and the height H of the undercut portion UC is 0.3 μm to 1.3 μm, the organic light emitting layer 116 is disconnected but the encapsulation layer 119 is not disconnected, and the GIP portion 200 or the lower line near the second transmissive portion TR2 may be prevented from being exposed to the high concentration etchant. Therefore, in the transparent display apparatus 100 according to one embodiment of the present disclosure, moisture permeation through the organic light emitting layer 116 disposed in the non-display area NDA may be avoided or reduced and thus reliability may be improved. The GIP portion 200 or the lower line, that is, the GIP line of the GIP area GDA near the second transmissive portion TR2 may be prevented from being damaged by the high concentration etchant, and thus durability may be improved.

The height H of the undercut portion UC is limited to 0.3 μm or more, but is not necessarily limited thereto. The height H of the undercut portion UC may be less than 0.3 μm and thicker (or higher) than the thickness of the organic light emitting layer 116 if the organic light emitting layer 116 may be disconnected.

As shown in FIG. 7, the undercut portion UC may be disposed at the edge of the second transmissive portion TR2 below the planarization layer 113. As the organic light emitting layer 116 is formed in a subsequent process, the organic light emitting layer 116 may be disconnected from, at and by the undercut portion UC, and a portion of the organic light emitting layer 116 may be disposed in the second transmissive portion TR2 positioned between the undercut portions UC. A portion of the organic light emitting layer 116 may be disposed on the upper surface of the first substrate 110, but is not limited thereto, and may vary depending on a layer in which the second transmissive portion TR2 is formed. For example, the portion of the organic light emitting layer 116 may be disposed on the upper surface of the buffer layer BL when the buffer layer BL is not etched during formation of the undercut portions UC. In addition, the capping layer 118 formed after the organic light emitting layer 116 may be disconnected from the undercut portion UC like the organic light emitting layer 116, and a portion of the capping layer 118 may be disposed in the second transmissive portion TR2 positioned between the undercut portions UC. As a result, since the undercut portion UC is disposed along the edge of the second transmissive portion TR2, the organic light emitting layer 116 and the capping layer 118 may be disconnected along the edge of the second transmissive portion TR2. That is, as shown in FIG. 7, the disconnected organic light emitting layer 116 and the disconnected capping layer 118 may overlap the second transmissive portion TR2 in the GIP area GDA. In some embodiments, the portion of the capping layer 118 between the undercut portions UC is separated from the buffer layer BL (or the gate insulating layer 111a), with the encapsulation layer 119 positioned therebetween, as shown in FIG. 7.

Although not shown, in the transparent display apparatus 100 according to one embodiment of the present disclosure, the second electrode 117 formed between the organic light emitting layer 116 and the capping layer 118 may also be formed in the non-display area NDA. In this case, since the non-display area NDA is similar to the structure of the display area DA, the difference in visual appearance between the non-display area NDA and the display area DA may be further reduced. The second electrode 117 disposed in the non-display area NDA may be disconnected from the undercut portion UC like the organic light emitting layer 116 of FIG. 7, but may not be disconnected from the undercut portion UC unlike the organic light emitting layer 116.

When the second electrode 117 disposed in the non-display area NDA is not disconnected from the undercut portion UC, since the second electrode 117 disposed in the non-display area NDA is disposed to overlay the planarization layer 113 together with the encapsulation layer 119, the transparent display apparatus 100 according to one embodiment of the present disclosure may further increase or maximize a moisture permeation prevention effect through the planarization layer 113.

Referring to FIGS. 6 and 7, in the transparent display apparatus 100 according to one embodiment of the present disclosure, in order to reduce the difference in visual appearance between the display area DA and the non-display area NDA, the first electrode 114' may be provided in the non-display area NDA. However, since the first electrode 114' provided in the non-display area NDA is provided to reduce the difference in visual appearance, the first electrode 114' may be formed to be patterned in the form of an island as shown in FIGS. 5 and 6 without an electrical function. Therefore, the first electrode 114' provided in the non-display area NDA may be a pattern electrode 114' having no electrical function (e.g., is electrically floating).

The first electrode 114' (or pattern electrode 114') provided in the non-display area NDA (or the GIP area GDA) may vary in shape depending on the shape of the second transmissive portion TR2. For example, as shown in FIG. 5, the first electrode 114' (or pattern electrode 114') disposed between the second transmissive portions TR2 in the first direction X may be formed in a jar shape having a convex protrusion, and the first electrode 114' (or pattern electrode 114') disposed between the second transmissive portions TR2 in the second direction Y may be formed in a rectangular shape. This is because the second transmissive portion TR2 includes a concave portion CP concavely recessed and a convex portion PP convexly protruded in the first direction X, and does not include a concave portion CP and a convex portion PP in the second direction Y. Therefore, when the second transmissive portion TR2 includes a concave portion CP and a convex portion PP in the second direction Y, the first electrode 114' (or pattern electrode 114') disposed between the second transmissive portions TR2 in the second direction Y may also be provided in a jar shape. A different reference numeral is used for the first electrode 114' (or pattern electrode 114') provided in the non-display area NDA (or the GIP area GDA) to distinguish from the reference numeral 114 of the first electrode 114 provided in the display area DA.

The first electrode 114' according to an example may be disposed on the planarization layer 113 that covers the GIP portion 200 of the GIP area GDA. As described above, in the transparent display apparatus 100 according to one embodiment of the present disclosure, since the organic light emitting layer 116 is provided even in in the non-display area NDA, the first electrode 114' may be formed before the organic light emitting layer 116 in the process order. In more detail, since the planarization layer 113, the first electrode 114' and the organic light emitting layer 116, which are disposed in the non-display area NDA, may be formed together with the planarization layer 113, the first electrode 114 and the organic light emitting layer 116, which are disposed in the display area DA, when the planarization layer 113, the first electrode 114 and the organic light emitting layer 116 are formed in the display area DA, the first electrode 114' of the non-display area NDA may be positioned between the planarization layer 113 and the organic light emitting layer 116 like the first electrode 114 of the display area DA.

Therefore, as shown in FIG. 6, in the transparent display apparatus 100 according to one embodiment of the present disclosure, since a cross-sectional structure of the subpixel SP in the display area DA and a cross-sectional structure disposed between the second transmissive portions TR2 in the non-display area NDA are similar to each other, the visibility difference between the display area DA and the non-display area NDA may be reduced, whereby a user may view a background or image in the direction of the rear surface of the display panel DP integrally.

In conclusion, in the transparent display apparatus 100 according to one embodiment of the present disclosure, as the second transmissive portion TR2 is provided in the non-display area NDA to be similar to the first transmissive portion TR1 provided in the display area DA, the visibility difference between the display area DA and the non-display area NDA may be reduced, and overall transmittance may be improved. In the non-display area NDA, an area (or dummy area) except the second transmissive portion TR2 is provided in a structure similar to that of the subpixel SP of the display area DA, whereby the visibility difference between the display area DA and the non-display area NDA may be further reduced.

Referring to FIG. 6 and FIG. 7, the second transmissive portion TR2 of the transparent display apparatus 100 according to one embodiment of the present disclosure is adjacent to or surrounded by two or more of the plurality of GIP portions 200. It should be understood that "surrounded" includes the meaning of "laterally surrounded" or "bracketed" (e.g., on two sides). For example, as shown in FIG. 7, one GIP portion 200 is on one side of the second transmissive portion TR2, and another GIP portion 200 is on the opposite side of the second transmissive portion TR2. The second transmissive portion TR2 may be "surrounded" by the GIP portions 200 in the cross-sectional view shown in FIG. 7, but may be clear of GIP portions 200 in another cross-sectional view transverse that shown in FIG. 7 (e.g., rotated 90 degrees around the vertical axis). As such, left and right sides of the second transmissive portion TR2 may be "surrounded" by the GIP portions 200, whereas front and back sides of the second transmissive portion TR2 may be "surrounded" by elements other than GIP portions 200.

Figure 8:
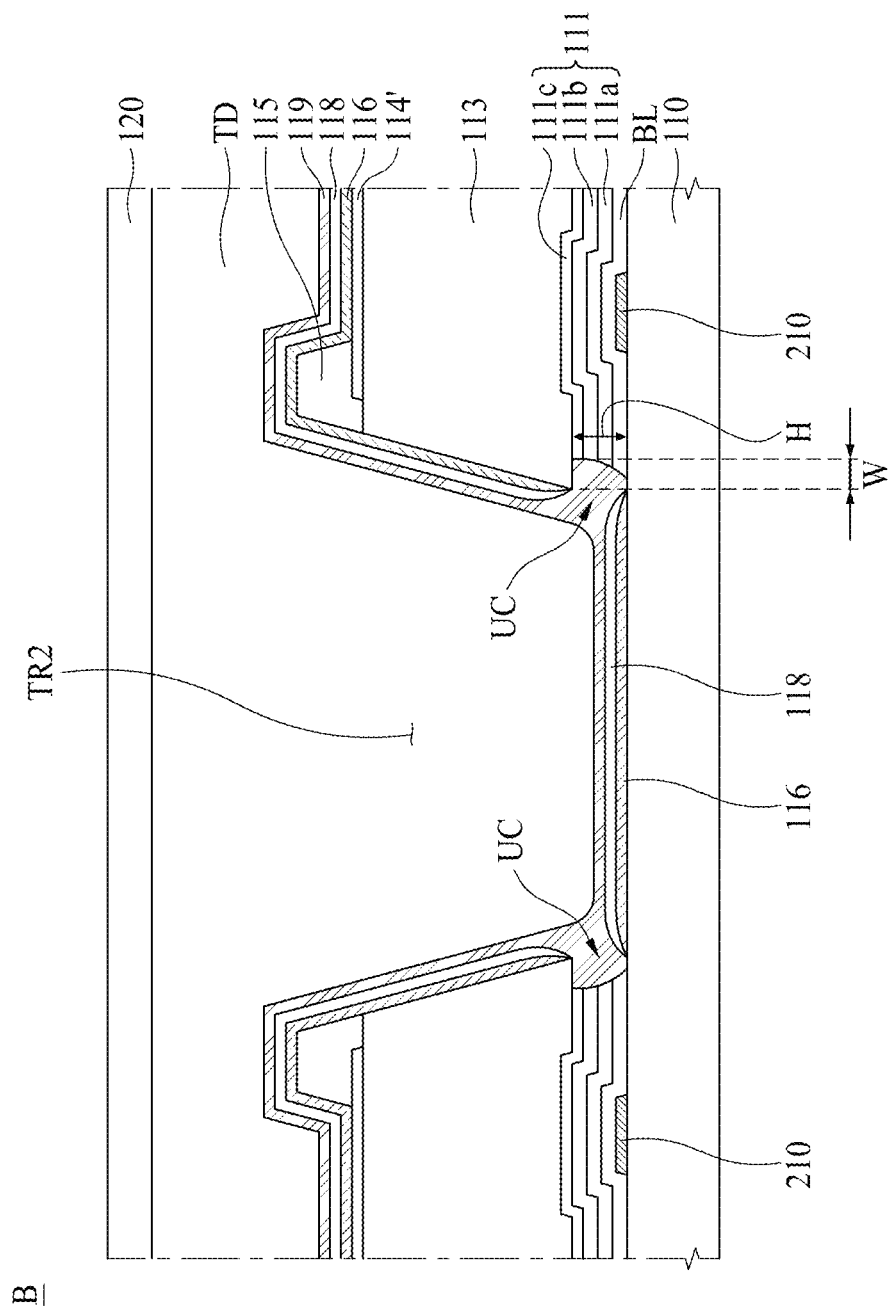
FIG. 8 is an enlarged view illustrating another example of a portion B of FIG. 6.

FIG. 8 is an enlarged view of another example of a portion B of FIG. 6.

In FIG. 7, although the second transmissive portion TR2 of the transparent display apparatus 100 according to one embodiment of the present disclosure is described as being surrounded by two or more of the plurality of GIP portions 200, the second transmissive portion TR2 of another example may be surrounded by two or more of the plurality of GIP lines 210 of the GIP area GDA. The same discussion of "surrounded" applies to relative orientation of the GIP lines 210 with respect to the second transmissive portion TR2.

In more detail, the GIP area GDA may further include a plurality of GIP lines 210 near the plurality of GIP portions 200, for example, lines for supplying signals or power sources, as well as the plurality of GIP portions 200, and the second transmissive portion TR2 may be surrounded by two or more GIP lines 210 as shown in FIG. 8.

Since the second transmissive portion TR2 shown in FIG. 8 is the same as the second transmissive portion TR2 shown in FIG. 7 except that the second transmissive portion TR2 is surrounded by the plurality of GIP lines 210, its detailed description will be omitted, and the following description will be based on a difference from FIG. 7.

The respective GIP lines 210 shown in FIG. 8 may be disposed between the first substrate 110 and the buffer layer BL. This is because the plurality of GIP lines 210 are formed together when LS line (not shown) provided between the first substrate 110 and the buffer layer BL of the display area DA is formed. Therefore, as shown in FIG. 8, the plurality of GIP lines 210 may be disposed between the buffer layer BL and the gate insulating layer 111a.

Each of the plurality of GIP lines 210 may be disposed at a position spaced apart from the undercut portion UC at a predetermined or selected distance. The reason why the GIP line 210 is spaced apart from the undercut portion UC at a predetermined or selected distance is that when the GIP line 210 is exposed from the undercut portion UC, the GIP line 210 may be damaged or broken due to water, etc., and thus lifetime of the product may be shortened. Therefore, each of the plurality of GIP lines 210 may be covered by an inorganic layer while being spaced apart from the undercut portion UC at a predetermined or selected distance.

The plurality of GIP lines 210 may be disposed between the first substrate 110 and the buffer layer BL, but are not limited thereto. Since the plurality of GIP lines 210 positioned in their respective layers different from one another may be positioned near the GIP portion 200, the second transmissive portion TR2 may be provided to be surrounded by the GIP line (not shown) positioned in another layer, not the GIP line 210 disposed between the first substrate 110 and the buffer layer BL. For example, the plurality of GIP lines 210 positioned in another layer may be any one of lines disposed between the buffer layer BL and the gate insulating layer 111a, lines disposed between the gate insulating layer 111a and the interlayer insulating layer 111b, and lines disposed between the interlayer insulating layer 111b and the protective layer 111c. When the plurality of GIP lines 210 are disposed between the gate insulating layer 111a and the interlayer insulating layer 111b, the plurality of GIP lines 210 may be formed together when the gate electrode 112b of the display area DA is formed, and when the plurality of GIP lines 210 are disposed between the interlayer insulating layer 111b and the protective layer 111c, the plurality of GIP lines 210 may be formed together when the source electrode 112c and the drain electrode 112d of the display area DA are formed.

As a result, in the transparent display apparatus 100 according to one embodiment of the present disclosure, as the second transmissive portion TR2 may be provided to be surrounded by two or more GIP portions 200 or surrounded by two or more GIP lines 210, the second transmissive portion TR2 may not overlap the GIP portion 200 or the GIP line 210, which includes a metal material. Therefore, the transparent display apparatus 100 according to one embodiment of the present disclosure may improve light transmittance in the non-display area NDA and at the same time, may reduce the visibility difference between the display area DA and the non-display area NDA.

Although not shown, the second transmissive portion TR2 may be provided to be surrounded by the GIP portion 200 and the GIP line 210. For example, the GIP portion 200 may be on one side of the second transmissive portion TR2, and the GIP line 210 may be on the opposite side of the second transmissive portion TR2. In another example, one or both sides of the second transmissive portion TR2 may include a GIP portion 200, a GIP line 210, or both.

Figure 9A:
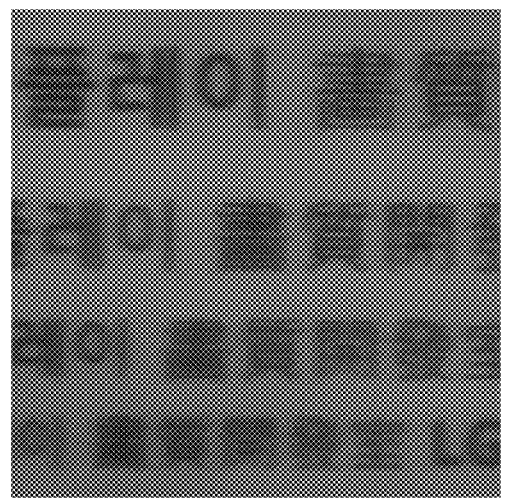
FIGS. 9a and 9b are views illustrating a haze reduction effect of a transparent display apparatus according to one embodiment of the present disclosure.
Figure 9A:
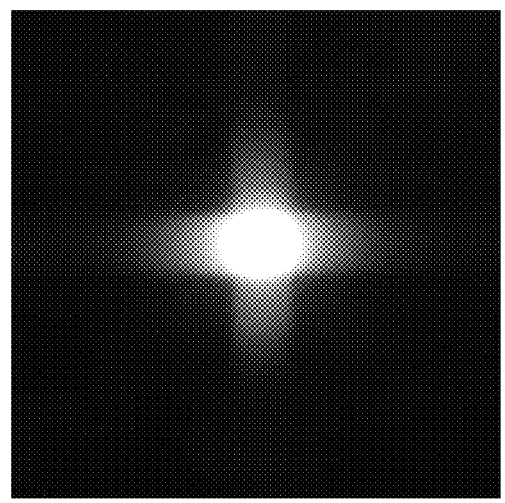
Figure 9B:
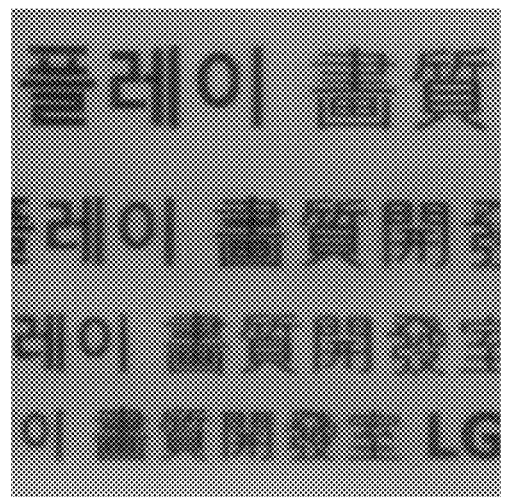
Figure 9B:
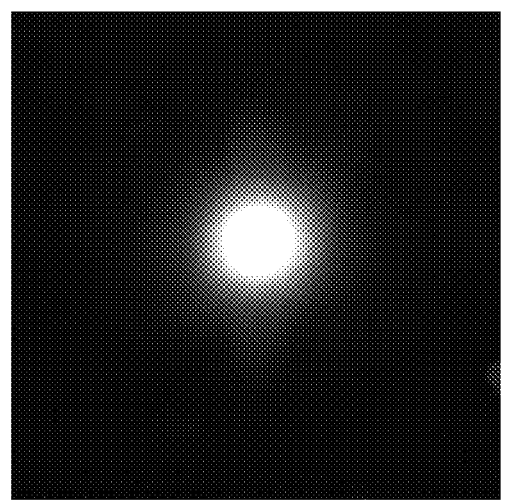

FIGS. 9a and 9b are views illustrating a haze reduction effect of a transparent display apparatus according to one embodiment of the present disclosure.

As described above, in the transparent display apparatus 100 according to one embodiment of the present disclosure, as the second transmissive portion TR2 is provided to include at least one concave portion CP and at least one convex portion PP, a haze phenomenon in which a background or image is viewed to be blurred or spread may be reduced.

FIG. 9a is a view showing a background or image that transmits the transmissive portion of the display panel when the transmissive portion is provided in a rectangular shape. As shown in FIG. 9a, the background or image that has transmitted the transmissive portion of the rectangular shape appears to be blurred or viewed in a cross shape as light is spread to the periphery without being concentrated due to the haze phenomenon.

As shown in FIG. 9b, when the second transmissive portion TR2 includes at least one concave portion CP and at least one convex portion PP, that is, in case of the transparent display apparatus 100 according to one embodiment of the present disclosure, the background or image that has transmitted the second transmissive portion TR2 may appear to be clear or in a circular shape as light is concentrated without being spread due to the reduction of the haze phenomenon.

As a result, in the transparent display apparatus 100 according to one embodiment of the present disclosure, as the second transmissive portion TR2 is disposed in the non-display area NDA, the visibility difference between the display area DA and the non-display area NDA may be reduced. Also, as the second transmissive portion TR2 is provided to include at least one concave portion CP and at least one convex portion PP, the haze phenomenon in the non-display area NDA may be reduced. Therefore, since a user may view a clear background or image having a reduced visibility difference with the display area DA even through the non-display area NDA, the user may view an integrated background or image between the display area DA and the non-display area NDA.

Meanwhile, in the present disclosure, the second transmissive portion TR2 has been described as including at least one concave portion CP and at least one convex portion PP, but is not limited thereto. The second transmissive portion TR2 may include at least one concave portion CP or at least one convex portion PP if the haze phenomenon may be reduced.

FIG. 10 is a schematic cross-sectional view taken along line shown in FIG. 3, and FIG. 11 is a schematic enlarged view illustrating a portion C of FIG. 10.

Referring to FIGS. 3, 10 and 11, the transparent display apparatus 100 according to one embodiment of the present disclosure may further include a non-pad portion NP.

The non-pad portion NP may be provided in the non-display area NDA. The non-pad portion NP according to an example may be provided in the other non-display area NDA except the pad area PA and the gate driver GD in the non-display area NDA. For example, the non-pad portion NP may be disposed in a fourth non-display area in which a plurality of power sharing lines PSL and a dummy pattern DPN are disposed. Hereinafter, the non-display area NDA, which includes the non-pad portion NP, will be defined as a non-pad area NPA (shown in FIG. 10). The non-pad area NPA may include a plurality of power sharing lines PSL and a dummy pattern DPN.

The plurality of power sharing lines PSL are for supplying a power source to the display area DA. The plurality of power sharing lines PSL according to an example may be disposed to be long in the first direction X in the non-pad area NPA to supply the power source to each area of the display area DA between the buffer layer BL and the planarization layer 113 (or circuit element layer 111), which are disposed in the non-display area NDA, but are not limited thereto. The plurality of power sharing lines PSL may be disposed between the first substrate 110 and the buffer layer BL or disposed inside the circuit element layer 111 in the non-display area NDA.

In the transparent display apparatus 100 according to one embodiment of the present disclosure, the second transmissive portion TR2 may be disposed in the non-pad area NPA of the non-display area NDA as well as the GIP area GDA of the non-display area NDA, whereby the visibility difference between the display area DA and the non-display area NDA may be reduced.

The second transmissive portion TR2 disposed in the non-pad portion NP (or non-pad area NPA) may be provided in the same shape as that of the second transmissive portion TR2 disposed in the GIP area GDA.

The second transmissive portion TR2 disposed in the non-pad portion NP (or non-pad area NPA) may be surrounded by two or more power sharing lines PSL among the plurality of power sharing lines PSL. For example, as shown in FIGS. 10 and 11, two or more of the plurality of power sharing lines PSL may be disposed to surround the second transmissive portion TR2 while being adjacent to the second transmissive portion TR2. In the transparent display apparatus 100 according to one embodiment of the present disclosure, the second transmissive portion TR2 may be disposed so as not to overlap the plurality of power sharing lines PSL made of a metal material, whereby light transmittance of the second transmissive portion TR2 disposed in the non-pad portion NP may be improved. The same discussion of "surrounded" applies to relative orientation of the power sharing lines PSL with respect to the second transmissive portion TR2 as described with reference to the GIP portions 200 and the GIP lines 210.

Referring to FIG. 10, the transparent display apparatus 100 according to one embodiment of the present disclosure may further include a dummy pattern DPN. The dummy pattern DPN may be formed in the non-display area NDA to reduce the visibility difference with a portion in which the power sharing line PSL is disposed in the non-display area NDA. The dummy pattern DPN according to an example may be formed below the planarization layer 113 to adjoin the dam DAM. Since the dummy pattern DPN is formed below the planarization layer 113 in the non-display area NDA, a step difference between the planarization layer 113 disposed on the power sharing line PSL and the planarization layer 113 disposed on the dummy pattern DPN may be mitigated. The dummy pattern DPN may be formed together in the non-pad area NPA when the GIP portion 200 or the GIP line 210 provided in the GIP area GDA is formed. The dummy pattern DPN may be formed to be patterned in an island shape so as to reduce a visibility difference or mitigate the step difference of the planarization layer 113, but is not limited thereto. In addition, the dummy pattern DPN may be made of a metal material the same as that of the GIP portion 200 or the GIP line 210, but is not limited thereto.

The dummy pattern DPN may be provided in the non-pad portion NP in order to reduce a visibility difference from an area where the thin film transistor 112 of the subpixel SP is disposed.

The dummy pattern DPN may be spaced apart from the plurality of power sharing lines PSL. As the dummy pattern DPN is disposed to be spaced apart from the plurality of power sharing lines PSL, a predetermined or selected space may be formed between the dummy pattern DPN and the plurality of power sharing lines PSL, and the second transmissive portion TR2 of the transparent display apparatus 100 according to one embodiment of the present disclosure may be disposed in the space.

In the transparent display apparatus 100 according to one embodiment of the present disclosure, as the second transmissive portion TR2 is disposed in at least one of the gate driver GD or the non-pad portion NP, the visibility difference between the display area DA and the non-display area NDA may be reduced. For example, the second transmissive portion TR2 is disposed in the other area except the area in which the pad area PA is disposed in the non-display area NDA surrounding the display area DA, whereby the visibility difference between the display area DA and the non-display area NDA may be reduced.

Although not shown, the transparent display apparatus 100 according to one embodiment of the present disclosure may include a plurality of dummy patterns DPN. In this case, the second transmissive portion TR2 may be disposed between the dummy patterns DPN. As a result, in the transparent display apparatus 100 according to one embodiment of the present disclosure, the second transmissive portion TR2 may be provided in at least one of between the plurality of power sharing lines PSL, between the power sharing line PSL and the dummy pattern DPN, or between the dummy patterns DPN in the non-pad portion NP (or non-pad area NPA).

In order to reduce the visibility difference between the display area DA and the non-display area NDA, at least one of the first electrode 114', the organic light emitting layer 116 and the second electrode 117 may be disposed in the non-pad portion NP like the gate driver GD. When the organic light emitting layer 116 is disposed in the non-pad portion NP, an undercut portion UC may be formed along the edge of the second transmissive portion TR2 to prevent moisture permeation through the organic light emitting layer 116 from occurring, whereby the organic light emitting layer 116 may be disconnected.

Meanwhile, in the present disclosure, although three second transmissive portions TR2 are described as being formed in a direction from the non-display area NDA to the display area DA in each of the gate driver GD and the non-pad portion NP, at least the one second transmissive portion TR2 may be provided in the direction from the non-display area NDA to the display area DA.

Also, in the present disclosure, although the three second transmissive portions TR2 are disposed in a line in the direction from the non-display area NDA to the display area DA, three or more second transmissive portions TR2, that is, a plurality of second transmissive portions TR2 may not be disposed in a line in the direction from the non-display area NDA to the display area DA. For example, the plurality of second transmissive portions TR2 may be alternately disposed in the direction from the non-display area NDA to the display area DA.

According to the present disclosure, the following advantageous effects may be obtained.

In the present disclosure, as the transmissive area (or second transmissive portion) is disposed in the non-display area, the visibility difference between the non-display area and the display area may be reduced.

Also, as the organic light emitting layer is provided to be disposed in the non-display area, the visibility difference between the non-display area and the display area may be further reduced.

In addition, in the present disclosure, as the organic light emitting layer disposed in the non-display area is provided to be disconnected, external water permeation through the organic light emitting layer may be avoided.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus, comprising:
    a substrate having a display area and a non-display area adjacent to the display area;
    a plurality of pixels disposed in the display area, having a first transmissive portion;
    a second transmissive portion disposed in the non-display area;
    a gate driver positioned in the non-display area, the gate driver including a plurality of gate driving circuits;
    a planarization layer disposed on the plurality of gate driving circuits;
    an undercut portion disposed between the substrate and the planarization layer; and
    an organic light emitting layer extended from the display area to the non-display area in which the second transmissive portion is disposed,
    wherein each of the plurality of gate driving circuits includes a plurality of gate driver in panel (GIP) portions, and
    wherein the undercut portion is disposed along an edge of the second transmissive portion.

2. The transparent display apparatus of claim 1, wherein at least two of the plurality of GIP portions are adjacent to the second transmissive portion.

3. The transparent display apparatus of claim 2, wherein the gate driver further includes a plurality of GIP lines near the plurality of GIP portions, and
    at least two of the plurality of GIP lines are adjacent to the second transmissive portion.

4. The transparent display apparatus of claim 2, wherein the non-display area includes a non-pad portion disposed in a region of the non-display area outside the gate driver and a pad area,
    the non-pad portion includes a plurality of power sharing lines for supplying a power source to the plurality of pixels, and
    at least two of the plurality of power sharing lines are adjacent to the second transmissive portion.

5. The transparent display apparatus of claim 4, wherein the non-pad portion includes a dummy pattern disposed to be spaced apart from the plurality of power sharing lines, and
    the second transmissive portion is disposed between the power sharing line and the dummy pattern.

6. The transparent display apparatus of claim 1, wherein the second transmissive portion is formed in the same shape as that of the first transmissive portion.

7. The transparent display apparatus of claim 1, wherein the second transmissive portion includes at least one concave portion and at least one convex portion.

8. The transparent display apparatus of claim 1, wherein each of the plurality of pixels includes:
    a first electrode disposed on the substrate;
    the organic light emitting layer provided on the first electrode; and a second electrode disposed on the organic light emitting layer.

9. The transparent display apparatus of claim 1, wherein the organic light emitting layer disposed in the non-display area has segments disconnected from each other by the undercut portion.

10. The transparent display apparatus of claim 1, further comprising a plurality of inorganic layers disposed between the substrate and the planarization layer,
wherein the plurality of inorganic layers has segments that are disconnected from each other by the undercut portion and the second transmissive portion.

11. The transparent display apparatus of claim 1, wherein a width of the undercut portion is 0.1 micrometers (µm) to 5 µm, and
a height of the undercut portion is 0.3 µm to 1.3 µm.

12. A transparent display apparatus, comprising:
a substrate having:
a display area having a first transmissive portion; and
a non-display area adjacent to the display area;
a transparent connection member disposed in the non-display area;
an opposite substrate facing the substrate, connected to the transparent connection member;
a gate driver positioned in the non-display area, the gate driver including a plurality of gate driving circuits,
a planarization layer disposed on the plurality of gate driving circuits; and
an undercut portion disposed between the substrate and the planarization layer,
wherein the substrate includes a second transmissive portion overlapped with the transparent connection member,
each of the plurality of gate driving circuits includes a plurality of gate driver in panel (GIP) portions, and
at least two of the plurality of GIP portions are adjacent to the second transmissive portion, and
wherein the undercut portion is disposed along an edge of the second transmissive portion.

13. The transparent display apparatus of claim 12, further comprising a transparent filling member disposed in the display area to be adjacent to the transparent connection member.

14. The transparent display apparatus of claim 13, wherein the transparent filling member includes an absorbing material that absorbs water, moisture or both.

15. The transparent display apparatus of claim 12, wherein the second transmissive portion includes at least one concave portion and at least one convex portion.

16. The transparent display apparatus of claim 12, wherein the display area includes an organic light emitting layer for emitting light,
the organic light emitting layer is extended to the non-display area, and
the organic light emitting layer disposed in the non-display area has segments disconnected from each other by the undercut portion.

17. A transparent display apparatus, comprising:
a substrate having:
a display area; and
a non-display area adjacent to the display area;
a pixel disposed in the display area, the pixel having a first transmissive portion;
a transparent connection member disposed in the non-display area;
a second transmissive portion disposed in the non-display area, the second transmissive portion being overlapped with the transparent connection member;
a gate driver positioned in the non-display area, the gate driver including a plurality of gate driving circuits;
a planarization layer disposed on a plurality of gate driving circuits; and
an undercut portion disposed between the substrate and the planarization layer,
wherein each of the plurality of pixels includes a first electrode disposed on the substrate;
an organic light emitting layer provided on the first electrode; and
a second electrode disposed on the organic light emitting layer, and
the organic light emitting layer is disposed to be extended to the non-display area in which the second transmissive portion is disposed,
wherein each of the plurality of gate driving circuits includes a plurality of gate driver in panel (GIP) portions, and
at least two of the plurality of GIP portions are adjacent to the second transmissive portion, and
wherein the undercut portion is disposed along an edge of the second transmissive portion.

18. The transparent display apparatus of claim 17, wherein the gate driver includes:
a first gate driver in panel (GIP) line on one side of the second transmissive portion; and
a second GIP line on the opposite side of the second transmissive portion.

* * * * *